(12) United States Patent
Jung

(10) Patent No.: US 10,553,598 B2
(45) Date of Patent: Feb. 4, 2020

(54) THREE-DIMENSIONAL SEMICONDUCTOR DEVICES INCLUDING VERTICAL STRUCTURES

(71) Applicant: Samsung Electronics Co., Ltd., Suwon-si, Gyeonggi-do (KR)

(72) Inventor: Young Jin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 16/012,046

(22) Filed: Jun. 19, 2018

(65) Prior Publication Data
US 2019/0157282 A1 May 23, 2019

(30) Foreign Application Priority Data
Nov. 20, 2017 (KR) .................. 10-2017-0154892

(51) Int. Cl.
| | |
|---|---|
| H01L 21/00 | (2006.01) |
| H01L 27/11556 | (2017.01) |
| H01L 27/11524 | (2017.01) |
| H01L 29/423 | (2006.01) |
| G11C 16/08 | (2006.01) |
| G11C 8/10 | (2006.01) |

(52) U.S. Cl.
CPC ........ H01L 27/11556 (2013.01); G11C 8/10 (2013.01); G11C 16/08 (2013.01); H01L 27/11524 (2013.01); H01L 29/42328 (2013.01)

(58) Field of Classification Search
CPC ........ H01L 27/11556; H01L 27/11582; H01L 27/11573
See application file for complete search history.

(56) References Cited

U.S. PATENT DOCUMENTS

| | | | |
|---|---|---|---|
| 8,324,060 B2 | 12/2012 | Park et al. | |
| 8,394,698 B2 | 3/2013 | Park et al. | |
| 9,362,306 B2 * | 6/2016 | Park | H01L 27/11582 |
| 9,412,749 B1 * | 8/2016 | Shimabukuro | H01L 23/5226 |
| 9,543,318 B1 * | 1/2017 | Lu | H01L 27/11582 |
| 9,564,471 B2 * | 2/2017 | Tang | H01L 27/101 |
| 9,601,577 B1 * | 3/2017 | Lee | H01L 27/11578 |
| 9,620,512 B1 * | 4/2017 | Nishikawa | H01L 27/11524 |
| 9,646,989 B1 * | 5/2017 | Yoshimizu | H01L 27/11578 |
| 9,685,452 B2 * | 6/2017 | Lee | H01L 27/11582 |

(Continued)

FOREIGN PATENT DOCUMENTS

KR 20190057669 A * 5/2019 ............... G11C 8/10

*Primary Examiner* — Laura M Menz
(74) *Attorney, Agent, or Firm* — Sughrue Mion, PLLC

(57) ABSTRACT

A three-dimensional semiconductor device is provided including a gate electrode disposed on a substrate and having a pad region, a cell vertical structure passing through the gate electrode, a dummy vertical structure passing through the pad region, and a gate contact plug disposed on the pad region. The cell vertical structure includes a cell pad layer disposed on a level higher than that of the gate electrode and a cell channel layer opposing the gate electrode, the dummy vertical structure includes a buffer region formed of a material different from that of the cell pad layer and a dummy channel layer formed of a material the same as that of the cell channel layer, and at least a portion of the buffer region is located on the same plane as at least a portion of the cell pad layer.

7 Claims, 33 Drawing Sheets

(56) References Cited

U.S. PATENT DOCUMENTS

| | | | |
|---|---|---|---|
| 9,953,992 B1* | 4/2018 | Ogawa | H01L 27/11556 |
| 10,074,667 B1* | 9/2018 | Higashi | H01L 27/1157 |
| 10,354,740 B2* | 7/2019 | Kim | |
| 2008/0296659 A1* | 12/2008 | Park | H01L 27/115 257/324 |
| 2015/0372005 A1* | 12/2015 | Yon | H01L 27/11582 257/5 |
| 2015/0372101 A1* | 12/2015 | Lee | H01L 27/11565 257/314 |
| 2017/0186767 A1* | 6/2017 | Baek | H01L 27/11565 |
| 2017/0207226 A1* | 7/2017 | Lee | H01L 27/11575 |
| 2017/0358356 A1* | 12/2017 | Lee | H01L 29/16 |
| 2018/0294225 A1* | 10/2018 | Lee | H01L 27/11565 |
| 2018/0374862 A1* | 12/2018 | Lee | H01L 27/11556 |
| 2019/0027490 A1* | 1/2019 | Shin | H01L 27/11582 |
| 2019/0035733 A1* | 1/2019 | Park | H01L 23/535 |
| 2019/0035798 A1* | 1/2019 | Hwang | H01L 27/11286 |
| 2019/0035807 A1* | 1/2019 | Kim | H01L 27/11582 |
| 2019/0157282 A1* | 5/2019 | Jung | H01L 27/11556 |
| 2019/0157283 A1* | 5/2019 | Jung | H01L 27/11556 |
| 2019/0267461 A1* | 8/2019 | Yada | H01L 29/42344 |

* cited by examiner

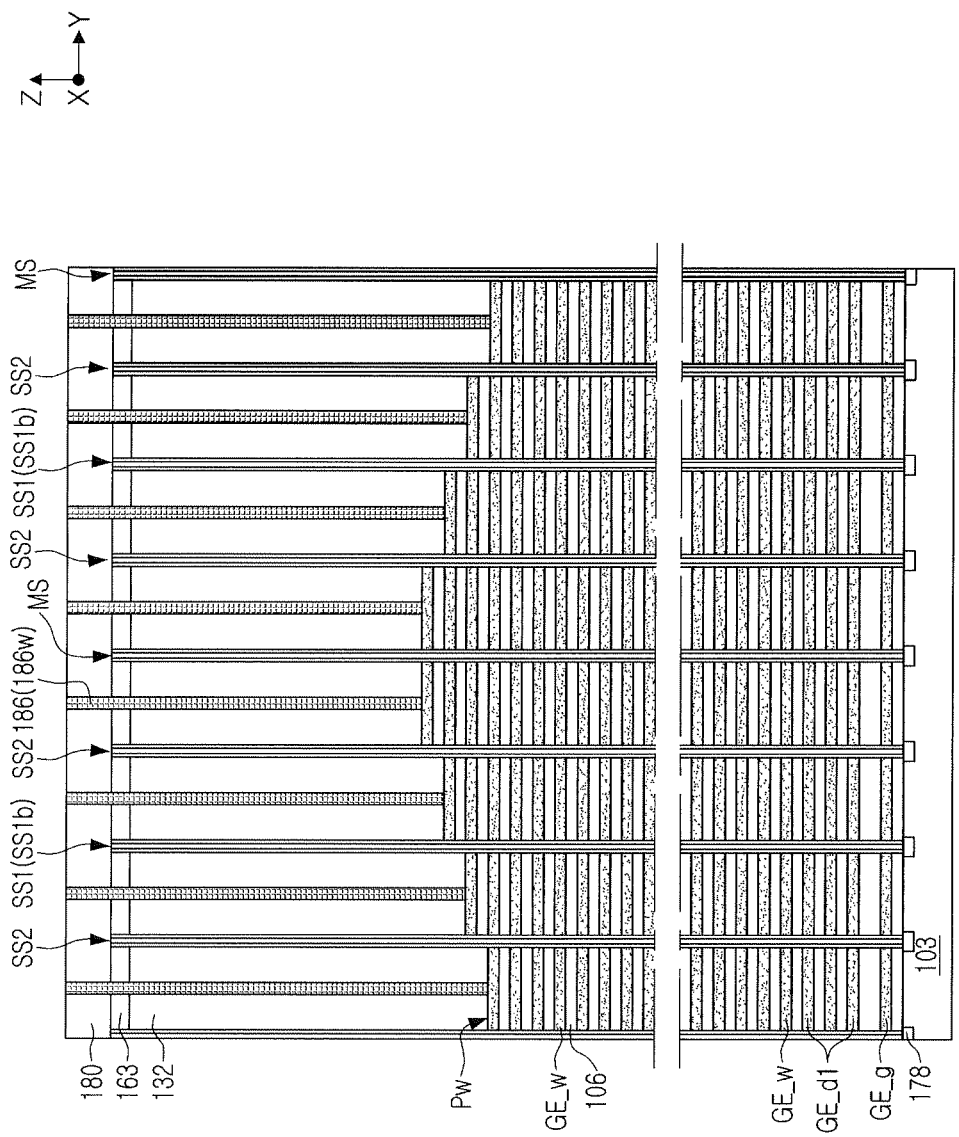

THREE-DIMENSIONAL SEMICONDUCTOR DEVICES INCLUDING VERTICAL STRUCTURES

CROSS-REFERENCE TO RELATED APPLICATION

This application claims the benefit of priority to Korean Patent Application No. 10-2017-0154892 filed on Nov. 20, 2017 in the Korean Intellectual Property Office, the disclosure of which is hereby incorporated herein by reference in its entirety.

FIELD

The present inventive concept relates to a semiconductor device, and more particularly, to a three-dimensional semiconductor device including vertical structures passing through gate electrodes.

BACKGROUND

A semiconductor device including gate electrodes stacked in a direction perpendicular to a surface of a semiconductor substrate has been developed. For high integration of a semiconductor device, the number of gate electrodes, having been stacked, has been increased. As described above, as the number of gate electrodes, stacked in a direction perpendicular to a surface of a semiconductor substrate, increases, a degree of difficulty of a gate forming process gradually increases, and unexpected defects occur.

SUMMARY

Some embodiments of the present inventive concept provide a three-dimensional semiconductor device including a gate electrode disposed on a substrate and having a pad region; a cell vertical structure passing through the gate electrode; a dummy vertical structure passing through the pad region; and a gate contact plug disposed on the pad region. The cell vertical structure includes a cell pad layer disposed on a level higher than that of the gate electrode and a cell channel layer opposing the gate electrode, the dummy vertical structure includes a buffer region formed of a material different from that of the cell pad layer and a dummy channel layer formed of a material the same as that of the cell channel layer, and at least a portion of the buffer region is located on the same plane as at least a portion of the cell pad layer.

Further embodiments of the present inventive concept provide a three-dimensional semiconductor device including a gate electrode disposed on a substrate; and a cell vertical structure and a dummy vertical structure spaced apart from each other while passing through the gate electrode. The cell vertical structure includes a cell channel layer opposing the gate electrode and a cell pad layer on the cell channel layer, the dummy vertical structure includes a buffer region formed of a material different from that of the cell pad layer, and at least a portion of the buffer region is located at the same level from the substrate as at least a portion of the cell pad layer or at least a portion of the cell channel layer.

Still further embodiments of the present inventive concept provide a three-dimensional semiconductor including a substrate including a memory cell array region and a connection region, adjacent to each other; gate electrodes sequentially stacked on the memory cell array region and extended to the connection region, the gate electrodes including pad regions disposed on the connection region; cell vertical structures disposed on the memory cell array region and passing through the gate electrodes; dummy vertical structures disposed on the connection region and passing through the pad regions; and gate contact plugs disposed on the connection region, disposed on the pad regions, and adjacent to the dummy vertical structures. Each of the cell vertical structures includes a cell pad layer located at a level higher than that of the gate electrodes and a cell channel layer opposing the gate electrodes, and at least one among the dummy vertical structures includes a buffer region formed of a material different from that of the cell pad layer and a dummy channel layer formed of a material the same as that of the cell channel layer.

BRIEF DESCRIPTION OF DRAWINGS

The above and other aspects, features and other advantages of the present disclosure will be more clearly understood from the following detailed description, taken in conjunction with the accompanying drawings, in which:

FIGS. 12A through 12C, and FIG. 14 are cross sections illustrating an exemplary example of a three-dimensional semiconductor device according to some embodiments of the present inventive concept.

DETAILED DESCRIPTION

Figure 1:
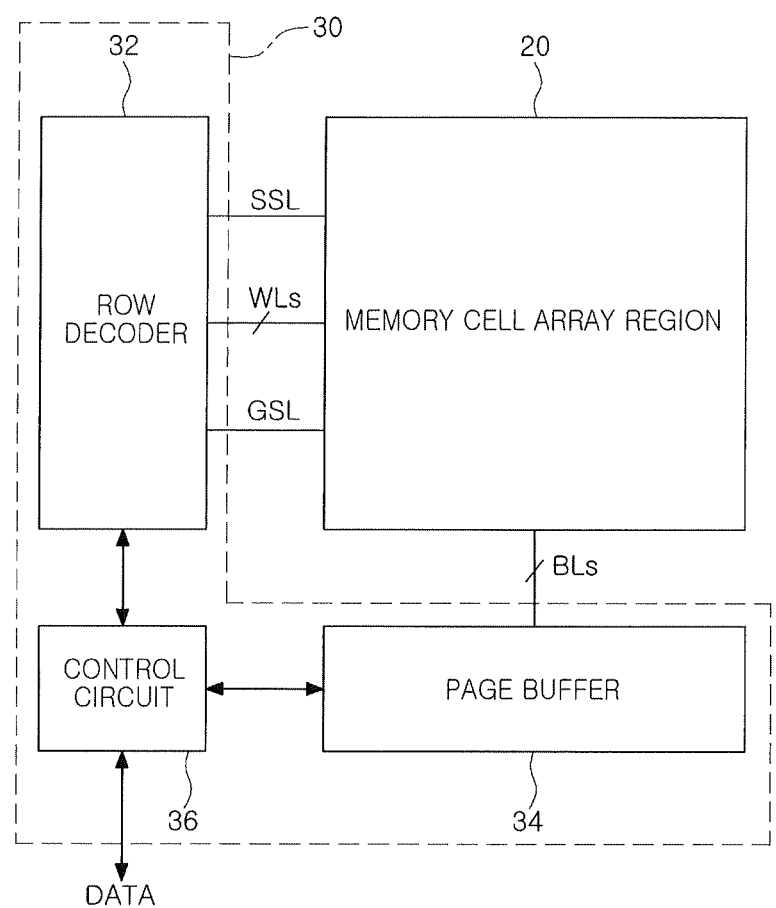
FIG. 1 is a schematic block diagram of a three-dimensional semiconductor device according to some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring first to FIG. 1, a schematic block diagram of a semiconductor device according some embodiments of the present inventive concept will be discussed. As illustrated in FIG. 1, a three-dimensional semiconductor device 10 may include a memory cell array region 20 and a control logic region 30.

The memory cell array region 20 includes a plurality of memory blocks, and each memory block of the plurality of memory blocks may include a plurality of memory cells. The control logic region 30 may include a row decoder 32, a page buffer 34, and a control circuit 36.

The plurality of memory cells in the memory cell array region 20 may be connected to the row decoder 32 through a string select line SSL, a plurality of word lines WLs, and a ground select line GSL, and may be connected to the page buffer 34 through bit lines BLs.

In some embodiments, a plurality of memory cells, arranged along the same row, are connected to the same word line WL, and a plurality of memory cells, arranged along the same column, may be connected to the same bit line BL.

The row decoder 32 may decode an input address, and thus may generate and may transmit driving signals of the word line WL. The row decoder 32 may provide a word line voltage, generated from a voltage generating circuit in the control circuit 36, to a word line selected among the word lines WLs and word lines not selected among the word lines WLs, in response to the control of the control circuit 36.

The page buffer 34 may be connected to the memory cell array region 20 through the bit lines BLs, and thus may decode data stored in the memory cells. The page buffer 34 may temporarily store data to be stored in the memory cells, or may detect data stored in the memory cells, depending on an operation mode. The page buffer 34 may include a column decoder and a sense amplifier.

The column decoder may selectively activate bit lines BLs of the memory cell array region 20, and the sense amplifier may detect a voltage of a bit line BL, selected by the column decoder, and read data stored in a memory cell, having been selected, during a reading operation. The control circuit 36 may control operations of the row decoder 32 and the page buffer 34. The control circuit 36 may receive a control signal and an external voltage, transmitted from an outside source, and may be operated according to the control signal, having been received. The control circuit 36 may include a voltage generating circuit generating voltages required for an internal operation using an external voltage, for example, a program voltage, a reading voltage, an erasing voltage, and the like. The control circuit 36 may control reading, writing, and/or erasing operations, in response to the control signals. Moreover, the control circuit 36 may include an input/output circuit. The input/output circuit may receive data (DATA) and transmit the data (DATA) to the page buffer 34 during a program operation, and may output the data (DATA), transmitted from the page buffer 34, externally, during a writing operation.

The three-dimensional semiconductor device 10 according to some embodiments may include a connection region for electrically connecting gate electrodes in the memory cell array region 20 to the control logic region 30. An example of the three-dimensional semiconductor device 10, including the memory cell array region 20 and the connection region, will be described with reference to FIG. 2. Here, FIG. 2 is a cross section illustrating an example of a three-dimensional semiconductor device according to some embodiments.

Figure 2:
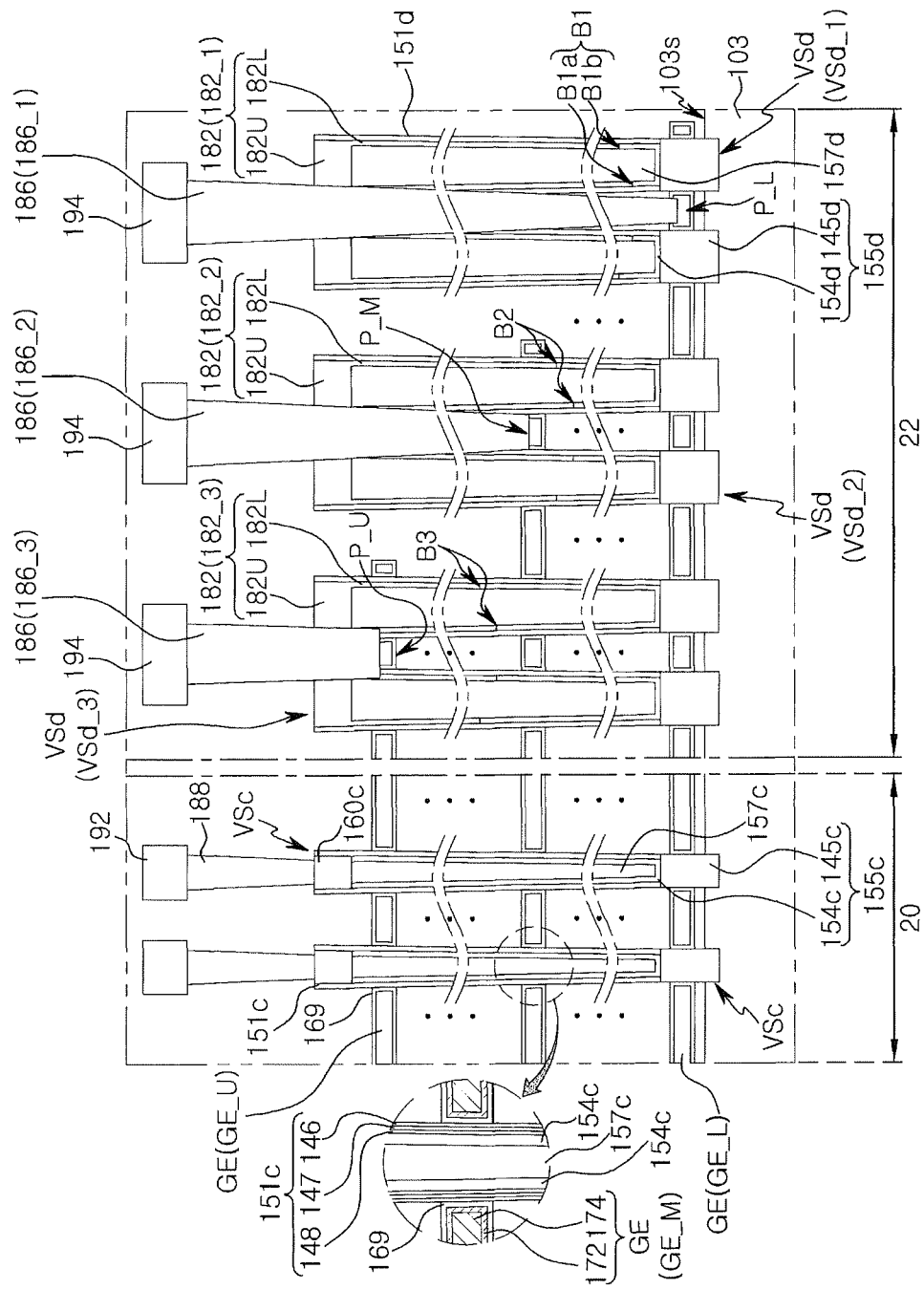
FIG. 2 is a cross section illustrating an exemplary example of a three-dimensional semiconductor device according to some embodiments of the present inventive concept.

Referring to FIG. 2, a substrate 103, having a memory cell array region 20 and a connection region 22 adjacent to the memory cell array region 20, may be provided. The substrate 103 may be a semiconductor substrate or a SOI semiconductor substrate. The substrate 103 may be a semiconductor substrate formed of a semiconductor material such as silicon.

Gate electrodes GE may be disposed on the substrate 103. The gate electrodes GE may be formed of a conductive material, including at least one among doped silicon, a metal nitride (e.g., TiN), a metal silicide (e.g., WSi, TiSi, TaSi, or the like), or a metal (e.g., W). The doped silicon may be polysilicon, including an N-type impurity (e.g., P, As, or the like) or a P-type impurity (e.g., B, or the like). The gate electrodes GE may include a first conductive layer 172 and a second conductive layer 174. The first conductive layer 172 may be extended to one side surface of the second conductive layer 174 while covering upper/lower surfaces of the second conductive layer 174. In some embodiments, the first conductive layer 172 may be formed of metal nitride such as TiN, or the like, and the second conductive layer 174 may be formed of a metal such as W, or the like.

The gate electrodes GE are sequentially stacked on the memory cell array region 20 in a direction perpendicular to a surface 103s of the substrate 103 and are spaced apart from each other, and may have pad regions extended to the connection region 22 and arranged in a staircase form in the connection region 22. The gate electrodes GE may form the string select line SSL, the word lines WLs, and the ground select line GSL, described with reference to FIG. 1.

The gate electrodes GE may include a lower gate electrode GE_L, an intermediate gate electrode GE_M on the lower gate electrode GE_L, and an upper gate electrode GE_U on the intermediate gate electrode GE_M. The lower gate electrode GE_L may have a lower pad region P_L on the connection region 22, the intermediate gate electrode GE_M may have an intermediate pad region P_M on the connection region 22, and the upper gate electrode GE_U may have an upper pad region P_U on the connection region 22.

In some embodiments, the lower/intermediate/upper gate electrodes GE_L, GE_M, and GE_U are exemplarily illustrated to describe the technical concept of the present inventive concept, and the technical concept of the present inventive concept may be understood as including a plurality of gate electrodes which may be disposed between the lower gate electrode GE_L and the intermediate gate electrode GE_M, and a plurality of gate electrodes which may be disposed between the intermediate gate electrode GE_M and the upper gate electrode GE_U.

Cell vertical structures VSc and dummy vertical structures VSd, extended in a direction perpendicular to the surface 103s of the substrate 103, may be disposed on the substrate 103.

The cell vertical structures VSc and the dummy vertical structures VSd may pass through the gate electrodes GE. The dummy vertical structures VSd may pass through pad regions P_U, P_M, and P_L of the gate electrodes GE.

The dummy vertical structures VSd may include a first dummy vertical structure VSd1, a second dummy vertical structure VSd2, and a third dummy vertical structure VSd3.

The first dummy vertical structure VSd1 may pass through the lower pad region P_L. The second dummy vertical structure VSd_2 may pass through the intermediate pad region P_M and the lower gate electrode GE_L below the intermediate pad region P_M. The third dummy vertical structure VSd3 may pass through the upper pad region P_U and the intermediate gate electrode GE_M and the lower gate electrode GE_L, below the upper pad region P_U.

Bit line contact plugs 188 may be disposed on the cell vertical structures VSc. Bit lines 192 may be disposed on the bit line contact plugs 188. The bit lines 192 may be the bit lines (BLs of FIG. 1) as illustrated in FIG. 1.

Gate contact plugs 186 may be disposed on the pad regions P_U, P_M, and P_L of the gate electrodes GE. Gate connection wires 194 may be disposed on the gate contact plugs 186. The gate connection wires 194 may be used to electrically connect the string select line SSL, the word lines WLs, and the ground select line GSL, illustrated in FIG. 1, to the row decoder 32.

The gate contact plugs 186 may include a first gate contact plug 186_1 to be electrically connected to the lower pad region P_L, a second gate contact plug 186_2 to be electrically connected to the intermediate pad region P_M, and a third gate contact plug 186_3 to be electrically connected to the upper pad region P_U. The gate contact plugs 186 may be formed of one among doped silicon, metal nitride (e.g., TiN) or a metal (e.g., W), or combinations thereof.

Each of the cell vertical structures VSc may include a cell channel layer 155c and a cell pad layer 160c. The cell pad layer 160c may be located at a level higher than that of the gate electrodes GE. The cell channel layer 155c may be formed of a single channel layer or a plurality of channel layers. For example, the cell channel layer 155c may include a lower cell channel layer 145c close to the substrate 103, and an upper cell channel layer 154c disposed on the lower cell channel layer 145c and in contact with the lower cell channel layer 145c.

In some embodiments, the lower cell channel layer 145c may oppose the lower gate electrode GE_L, and the upper cell channel layer 154c may oppose the intermediate gate electrode GE_M and the upper gate electrode GE_U.

The cell channel layer 155c may be formed of a semiconductor material. For example, the cell channel layer 155c may be formed of a semiconductor material such as silicon. For example, the lower cell channel layer 145c may include epitaxial silicon growing from the substrate 103 and formed in an epitaxial process, while the upper cell channel layer 154c may include silicon formed in an ALD or CVD deposition process. The upper cell channel layer 154c may be formed of polysilicon.

The cell pad layer 160c may be formed of doped silicon. For example, the cell pad layer 160c may be formed of polysilicon having N-type conductivity.

In some embodiments, each of the cell vertical structures VSc may include a cell core pattern 157c disposed below the cell pad layer 160c while a lower portion and a side wall thereof are surrounded by the upper cell channel layer 154c. The cell core pattern 157c may be formed of an insulating material such as silicon oxide, or the like.

In some embodiments, each of the cell vertical structures VSc may include a first gate dielectric 151c. The first gate dielectric 151c may be disposed between the upper cell channel layer 154c and the gate electrodes GE.

In some embodiments, a second gate dielectric 169 may be disposed between the gate electrodes GE and the cell vertical structures VSc. In some embodiments, the second gate dielectric 169 may be extended to upper/lower surfaces of the gate electrodes GE.

One of the first gate dielectric 151c and the second gate dielectric 169 may include a layer which can store data. For example, the first gate dielectric 151c may include a layer which can store data. However, the technical scope of the present inventive concept is not limited thereto. For example, the second gate dielectric 169 may include a layer which can store data. Hereinafter, embodiments in which the first gate dielectric 151c includes a layer which can store data will be described.

The first gate dielectric 151c may include a tunnel dielectric layer 148, a data storage layer 147, and a blocking dielectric layer 146. The data storage layer 147 may be disposed between the tunnel dielectric layer 148 and the blocking dielectric layer 146. The tunnel dielectric layer 148 may be close to the upper cell channel layer 154c, and the blocking dielectric layer 146 may be close to the gate electrodes GE. The tunnel dielectric layer 148 may include silicon oxide and/or impurity doped silicon oxide. The blocking dielectric layer 146 may include silicon oxide and/or a high dielectric. The data storage layer 147 may be interposed between the upper cell channel layer 154c and the gate electrodes GE, and may be layer for storing data in a nonvolatile memory device such as a flash memory device. For example, the data storage layer 147 may be formed of a material, which traps an electron injected through the tunnel dielectric layer 148 from the upper cell channel layer 154c and retains the electron, or which erases an electron trapped in the data storage layer 147, according to operating conditions of a nonvolatile memory device such as a flash memory device, or the like, for example, silicon nitride. The second gate dielectric 169 may include a high dielectric (e.g., AlO, or the like).

The data storage layer 147 may store data in a region opposing the intermediate gate electrode GE_M, among the gate electrodes GE, which may correspond to the word lines WLs described with reference to FIG. 1. Regions which may store data in the data storage layer 147 in one cell vertical structure, among the cell vertical structures VSc, may be arranged in a direction perpendicular to the surface 103s of the substrate 103, and may form memory cells in the memory cell array region 20 described with reference to FIG. 1.

On the connection region 22, each of the dummy vertical structures VSd may include a buffer region 182, a dummy channel layer 155d, a dummy gate dielectric 151d, and a dummy core pattern 157d.

The dummy core pattern 157d may be formed of a material the same as that of the cell core pattern 157c, and may be formed to have a greater width than that of the cell core pattern 157c.

The dummy channel layer 155d may include a lower dummy channel layer 145d and an upper dummy channel layer 154d on the lower dummy channel layer 145d. The lower dummy channel layer 145d may be formed of a material the same as that of the lower cell channel layer 145c, and the upper dummy channel layer 154d may be formed of a material the same as that of the upper cell channel layer 154c.

At least a portion of the buffer region 182 may be located on the same plane as at least a portion of the cell pad layer 160c. At least a portion of the buffer region 182 may be located at the same level from the substrate 103 as at least a portion of the cell pad layer 160c or at least a portion of the cell channel layer 155c.

The buffer region 182 may include a lower portion 182L and an upper portion 182U on the lower portion 182L. The upper portion 182U of the buffer region 182 may be disposed on the dummy core pattern 157d, and may be disposed on a level higher than that of the gate electrodes GE. The upper portion 182U of the buffer region 182 may be located on the same plane as the cell pad layer 160c. The upper portion 182U of the buffer region 182 may be located at the same level from the substrate 103 as the cell pad layer 160c.

The lower portion 182L of the buffer region 182 is extended downwardly from a portion of the upper portion 182U, is in contact with the upper cell channel layer 154c, and may be disposed on a side surface of the dummy core pattern 157d. The lower portion 182L of the buffer region 182 may be located at the same level from the substrate 103 as at least a portion of the cell channel layer 155c.

In the buffer region 182, the upper portion 182U and the lower portion 182L may be integrally formed. The buffer region 182 may electrically insulate the dummy channel layer 155d from the gate contact plugs 186. The buffer region 182 may prevent leakage current or electrical shorts between the dummy channel layer 155d and the gate contact plugs 186. The buffer region 182 may be formed of a different material from that of the cell pad layer 160c.

In some embodiments, the buffer region 182 may be formed of silicon nitride. However, the technical scope of the present inventive concept is not limited thereto. For example, the buffer region 182 may be formed of silicon oxide or silicon oxynitride (SiON). In another example, the buffer region 182 may be in a state, not filled with a material in a solid state, or may be in a state, filled with a gas. In some embodiments, in the buffer region 182, a portion of the buffer region may be formed of an insulating material in a solid state, and another portion thereof may be formed to have an empty space such as a void, or the like. Thus, in a three-dimensional semiconductor device according to the technical concept of the present inventive concept, the buffer region 182 may include an insulating material and/or an empty space.

The dummy gate dielectric 151*d* may be formed of the same material or as the same layers as that of the first gate dielectric 151*c*. The dummy gate dielectric 151*d* may be formed to have the same thickness as that of the first gate dielectric 151*c*.

Among the dummy vertical structures VSd, a boundary B1 between the lower portion 182L of the buffer region 182 in the first dummy vertical structure VSd_1 and the dummy channel layer 155*d* may be closer to the substrate 103 than a boundary B2 between the lower portion 182L of the buffer region 182 in the second dummy vertical structure VSd_2 and the dummy channel layer 155*d*. The boundary B2 between the lower portion 182L of the buffer region 182 in the second dummy vertical structure VSd_2 and the dummy channel layer 155*d* may be closer to the substrate 103 than a boundary B3 between the lower portion 182L of the buffer region 182 in the third dummy vertical structure VSd_3 and the dummy channel layer 155*d*.

In one dummy vertical structure, a boundary between the lower portion 182L of the buffer region 182 and the dummy channel layer 155*d* may be closer to the substrate 103 as the boundary therebetween is closer to a side surface of a dummy vertical structure opposing the gate contact plugs 186. For example, in the boundary B1 between the lower portion 182L of the buffer region 182 in the first dummy vertical structure VSd_1 and the dummy channel layer 155*d*, a boundary portion B1*a* close to a side surface of the first dummy vertical structure VSd_1, opposing the first gate contact plug 186_1 may be closer to the substrate 103 than a boundary portion B1*b* close to the side surface of the first dummy vertical structure VSd_1, not opposing a gate contact plug 186.

Figure 3:
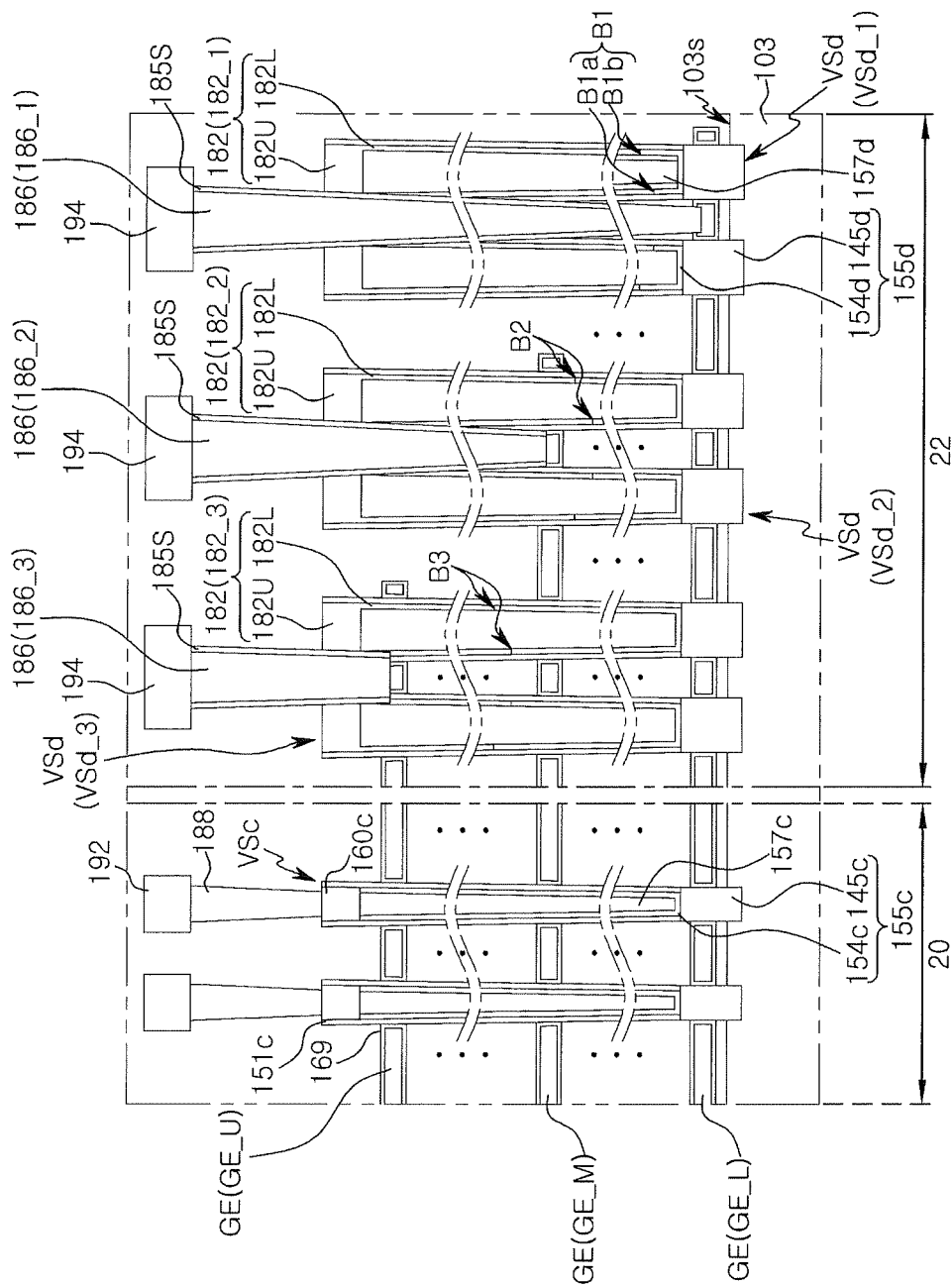
FIG. 3 is a cross section conceptually illustrating a modified example of a three-dimensional semiconductor device according to some embodiments of the present inventive concept.

In some embodiments, the buffer regions 182 of the dummy vertical structures VSd may be directly in contact with the gate contact plugs 186. However, the technical scope of the present inventive concept is not limited thereto. Buffer spacers disposed between the dummy vertical structures VSd and the gate contact plugs 186 in accordance with some embodiments will be described with reference to FIG. 3. FIG. 3 is a cross section conceptually illustrating some embodiments of a three-dimensional semiconductor device according to some embodiments.

Referring to FIG. 3, buffer spacers 185S may be disposed on side walls of the gate contact plugs 186. The buffer spacers 185S may be extended to side walls of the gate contact plugs 186 from buffer regions 182 of the dummy vertical structures VSd. The buffer spacers 185S may be integrally formed with the buffer regions 182. The buffer spacers 185S may be formed of the same insulating material (e.g., silicon nitride, or the like) as an insulating material forming the buffer regions 182.

Figure 4:
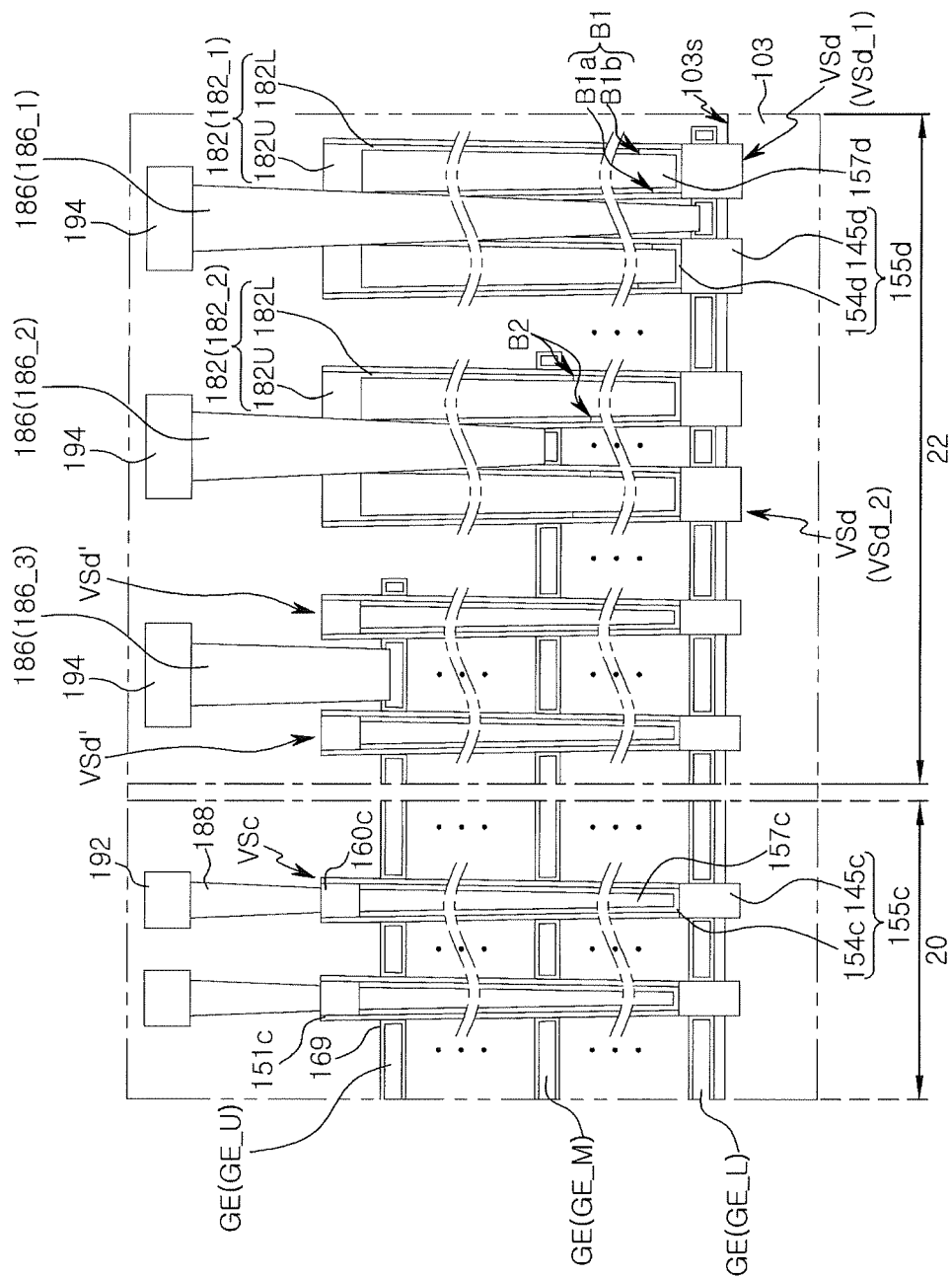
FIG. 4 is a cross section conceptually illustrating a modified example of a three-dimensional semiconductor device according to some embodiments of the present inventive concept.

In some embodiments, the dummy vertical structures VSd may have the same size. However, the technical scope of the present inventive concept is not limited thereto. For example, some dummy vertical structures among the dummy vertical structures VSd may have the same size as the cell vertical structures VSc. A modified example described above will be described with reference to FIG. 4. FIG. 4 is a cross section conceptually illustrating a three-dimensional semiconductor device according to some embodiments.

Referring to FIG. 4, among the dummy vertical structures VSd, the first dummy vertical structure VSd_1 and the second dummy vertical structure VSd_2 may have greater widths than those of the cell vertical structures VSc, as described with reference to FIG. 2.

Among the dummy vertical structures VSd, the third dummy vertical structure (VSd_3 of FIG. 2) described with reference to FIG. 2 may be deformed to a third dummy vertical structure VSd' having a smaller width than those of the first dummy vertical structure VSd_1 and the second dummy vertical structure VSd_2. The third dummy vertical structure VSd' may be formed to have the same structure, the same material, and the same size as those of the cell vertical structures VSc, and may be spaced apart from the gate contact plugs 186. The third dummy vertical structure VSd' may not include the buffer region 182 in the first dummy vertical structure VSd_1 and the second dummy vertical structure VSd_2.

Figure 5:
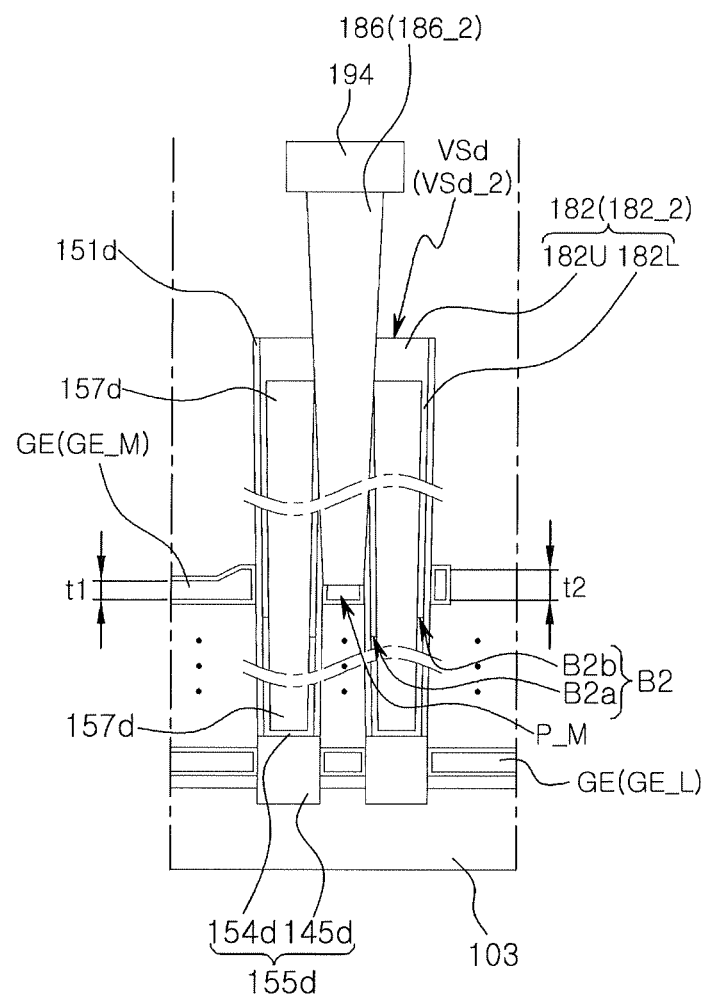
FIG. 5 is a cross section conceptually illustrating a modified example of a three-dimensional semiconductor device according to some embodiments of the present inventive concept.

Again, referring to FIG. 2, the pad regions of the gate electrodes GE may have the same thickness as those of the gate electrodes GE. However, the technical scope of the present inventive concept is not limited thereto. The pad regions of the gate electrodes GE may have thicknesses, greater than thicknesses of the gate electrodes GE. A modified example of thicknesses of the pad regions of the gate electrodes GE described above will be described with reference to FIG. 5. FIG. 5 is a cross section conceptually illustrating a three-dimensional semiconductor device, in order to describe a modified example of the gate electrodes GE.

Referring to FIG. 5, in the gate electrodes GE, a portion of the gate electrode, adjacent to the cell vertical structures VSc, has a first thickness, and a portion of the gate electrode, adjacent to the dummy vertical structures VSd, has a second thickness, greater than the first thickness. For example, among the gate electrodes GE, the intermediate gate electrode GE_M adjacent to the cell vertical structures VSc may have a first thickness t1, and the intermediate pad region P_M of the intermediate gate electrode GE_M adjacent to the dummy vertical structures VSd may have a second thickness t2 greater than the first thickness t1. The intermediate pad region P_M may be thicker than the intermediate gate electrode GE_M. In this regard, even when the second gate contact plug 186_2 is extended into an interior of the intermediate pad region P_M, the intermediate pad region P_M may be not penetrated by the second gate contact plug 186_2. The thickness relationship between the intermediate pad region P_M and the intermediate gate electrode GE_M may be equally applied to the relationship between other pad regions and other gate electrodes.

In some embodiments, at a boundary B2 between the lower portion 182L of a buffer region 182_2 in the second dummy vertical structure VSd_2 and the dummy channel layer 155*d*, a boundary portion B2*a* close to a side surface of the second dummy vertical structure VSd_2, opposing the second gate contact plug 186_2 may be closer to the substrate 103 than a boundary portion B2*b* close to a side surface of the second dummy vertical structure VSd_2, not opposing the gate contact plug 186.

Figure 6:
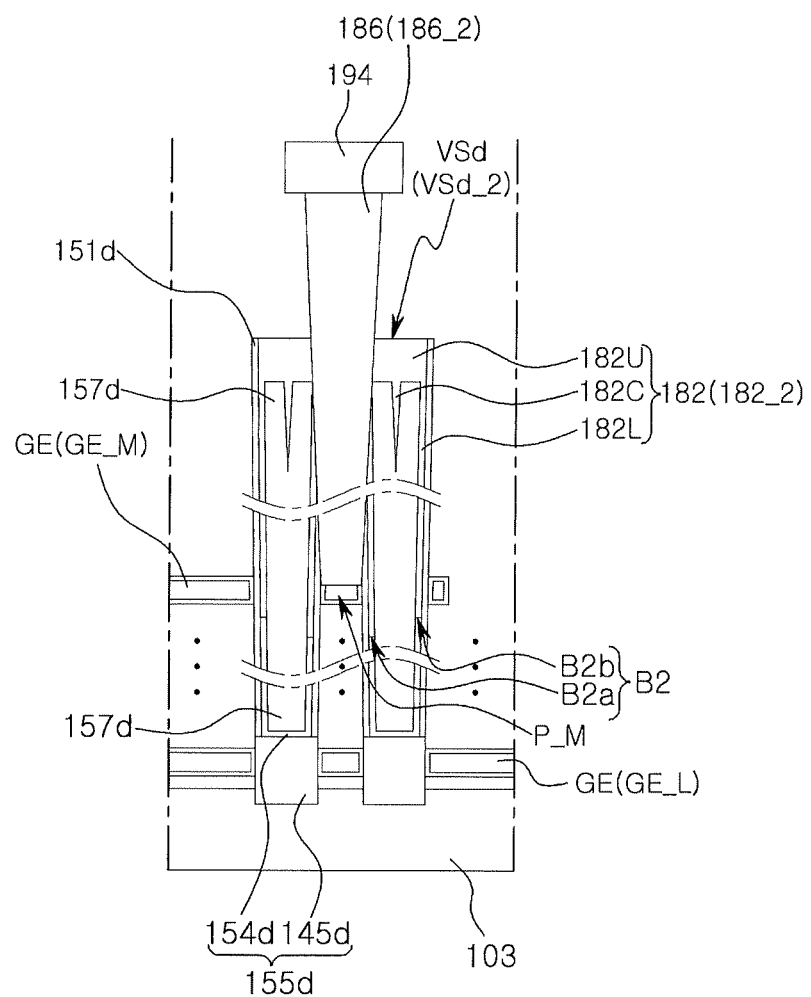
FIG. 6 is a cross section conceptually illustrating a modified example of a three-dimensional semiconductor device according to some embodiments of the present inventive concept.

Again, referring to FIG. 2, the buffer region 182 may include the upper portion 182U disposed on the dummy core pattern 157*d* and the lower portion 182L extended from an edge of the upper portion 182U to a side surface of the dummy core pattern 157d, but the technical concept of the present inventive concept is not limited thereto. A modified example of the buffer region 182 will be described with reference to FIG. 6. FIG. 6 is a cross section conceptually illustrating a three-dimensional semiconductor device, in order to describe a modified example of the buffer region 182.

Referring to FIG. 6, the buffer region 182 may include an extended portion 182C extended to an interior of the dummy core pattern 157d from a central portion of the upper portion 182U, together with the upper portion 182U disposed on the dummy core pattern 157d, the lower portion 182L extended to a side surface of the dummy core pattern 157d from an edge of the upper portion 182U.

Figure 7A:
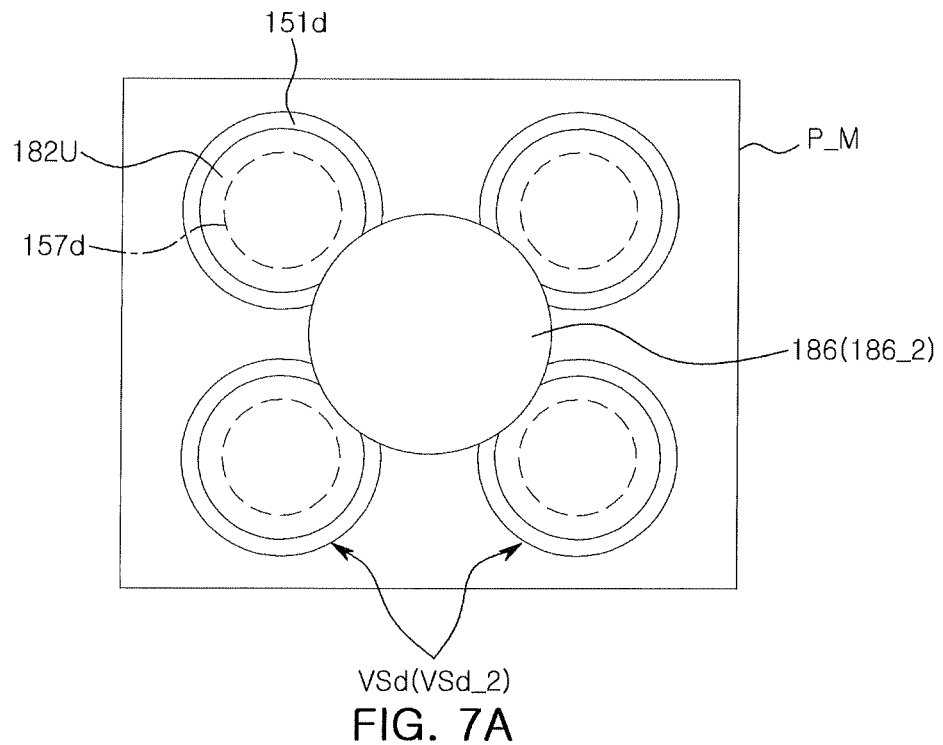
FIGS. 7A and 7B are plan views illustrating an exemplary example of a three-dimensional semiconductor device according to some embodiments of the present inventive concept.

Next, with reference to FIGS. 7A, 7B, 8A, and 8B, respectively, examples of a planar shape between the dummy cell vertical structures VSd and the gate contact plugs 186 will be described. FIG. 7A is a plan view illustrating an exemplary planar shape of the upper portion 182U of the buffer region 182 and the dummy cell vertical structures VSd, FIG. 8A is a plan view illustrating a modified example of a planar shape of the upper portion 182U of the buffer region 182 and the dummy cell vertical structures VSd, FIG. 7B is a plan view illustrating an exemplary planar shape of the lower portion 182L of the buffer region 182 and the dummy cell vertical structures VSd, and FIG. 8B is a plan view illustrating a modified example of a planar shape of the lower portion 182L of the buffer region 182 and the dummy cell vertical structures VSd.

First, referring to FIGS. 2 and 7A, the upper portion 182U of the buffer region 182 located on the same plane as the second gate contact plug 186_2 may cover the entirety of an upper surface of the dummy core pattern 157d. However, the technical scope of the present inventive concept is not limited thereto. For example, as illustrated in FIG. 8A, the upper portion 182U of the buffer region 182, located on the same plane as the second gate contact plug 186_2, may be deformed to cover a portion of the dummy core pattern 157d, and a remaining portion of the dummy core pattern 157d may be covered by a dummy pad layer 160d. The dummy pad layer 160d may be formed of a material the same as that of the cell pad layer 160c.

Figure 7B:
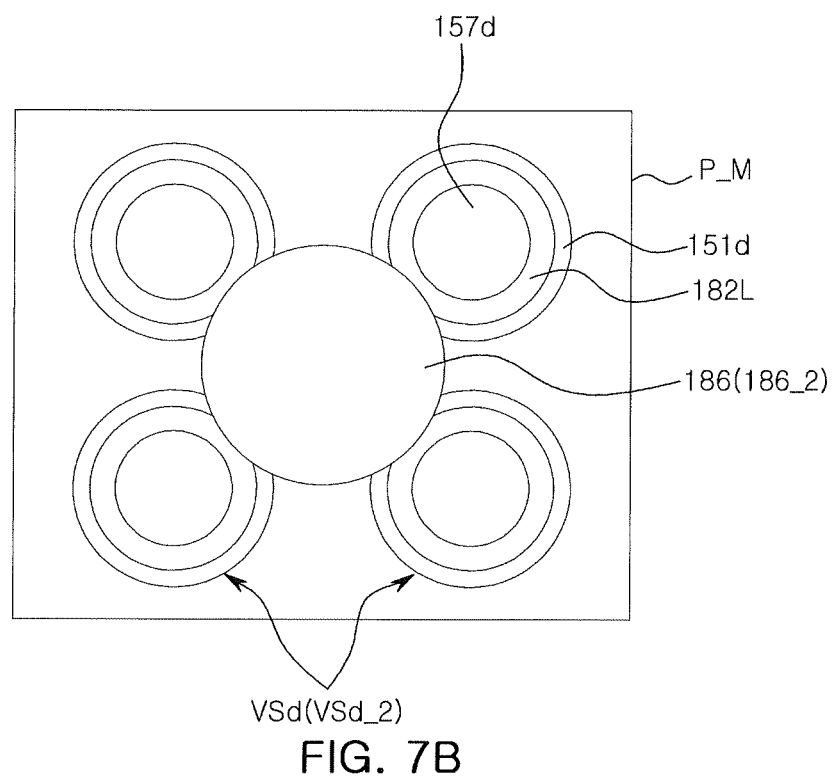
Figure 8A:
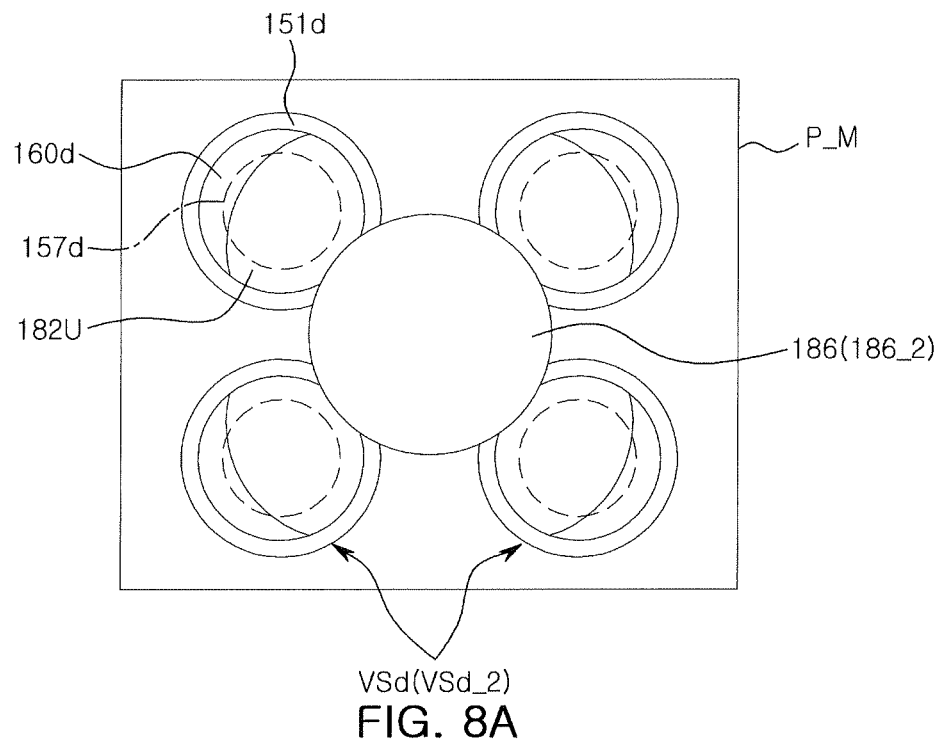
FIGS. 8A and 8B are plan views illustrating a modified example of a three-dimensional semiconductor device according to some embodiments of the present inventive concept.
Figure 8B:
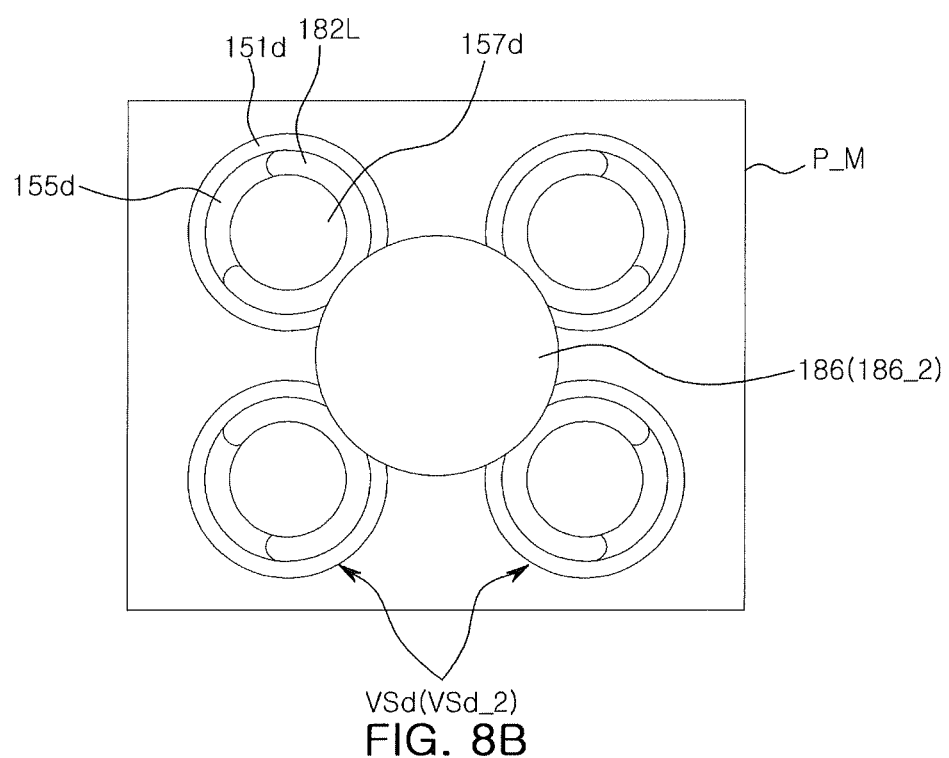

Next, referring to FIGS. 2 and 7B, the lower portion 182L of the buffer region 182 located on the same plane as the second gate contact plug 186_2 may be disposed to surround the entirety of a side surface of the dummy core pattern 157d. However, the technical scope of the present inventive concept is not limited thereto. For example, as illustrated in FIG. 8B, the lower portion 182L of the buffer region 182 located on the same plane as the second gate contact plug 186_2 may be deformed to cover a portion of the side surface of the dummy core pattern 157d, while a remaining portion of the side surface of the dummy core pattern 157d may be covered by the dummy channel layer 155d on the same plane.

Figure 9A:
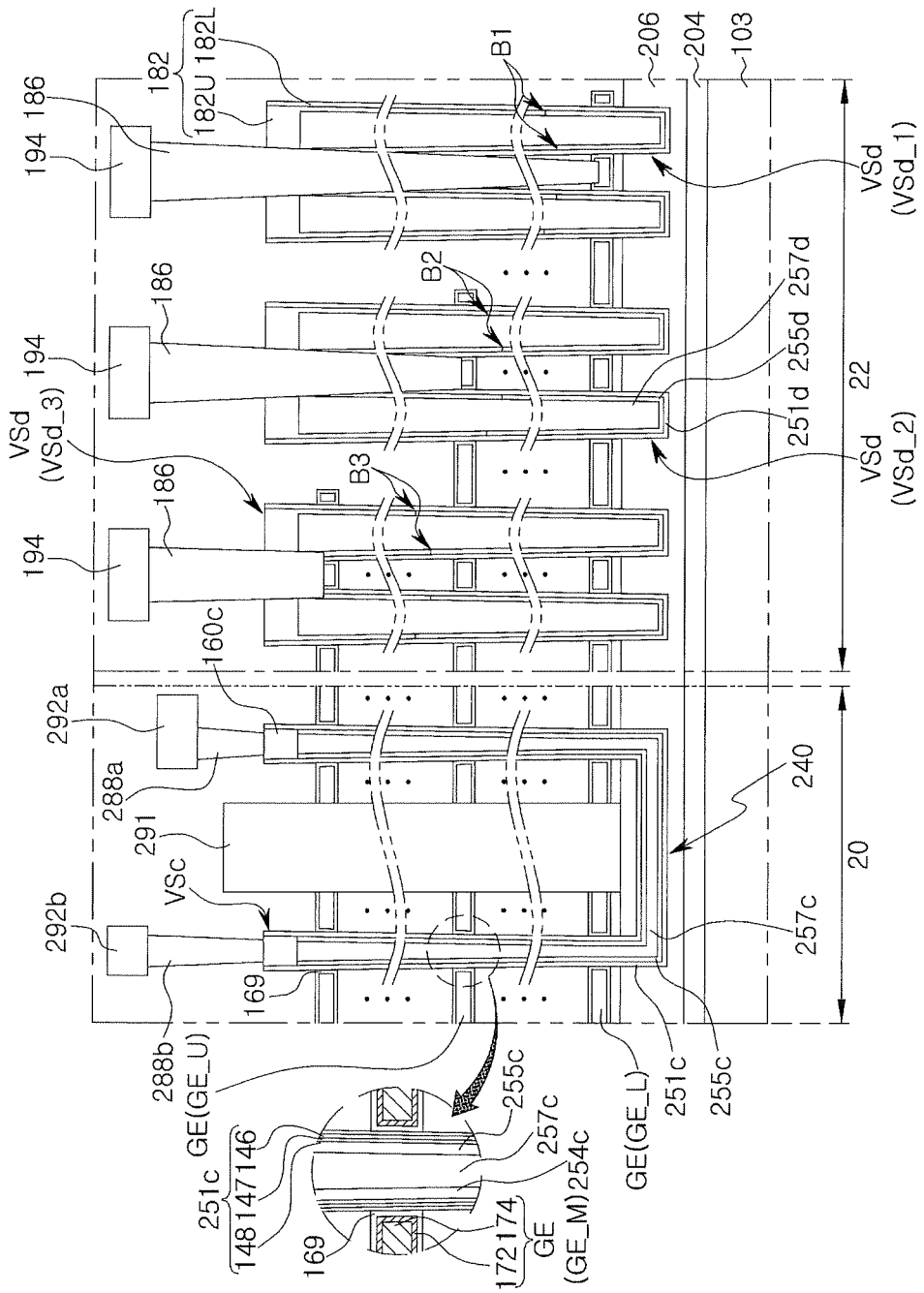
FIG. 9A is a cross section conceptually illustrating a modified example of a three-dimensional semiconductor device according to some embodiments of the present inventive concept.

The cell vertical structures VSc, described above, may be spaced apart from each other. However, the technical scope of the present inventive concept is not limited thereto. For example, by means of a connection portion connecting lower portions of the cell vertical structures VSc, the cell vertical structures VSc of which lower portions are connected to each other may be provided. An exemplary example of the cell vertical structures VSc of which lower portions are connected to each other will be described with reference to FIG. 9A. FIG. 9A is a cross section conceptually illustrating a modified example of a three-dimensional semiconductor device according to some embodiments.

Referring to FIG. 9A, the same gate electrodes GE as those described with reference to FIG. 2 may be disposed on the substrate 103. The gate electrodes GE may include the lower gate electrode GE_L having the lower pad region P_L, the intermediate gate electrode GE_M having the intermediate pad region P_M, and the upper gate electrode GE_U having the upper pad region P_U, in the same manner as described with reference to FIG. 2.

The gate contact plugs 186, the same as those described with reference to FIG. 2, may be disposed on pad regions of the gate electrodes GE, and the gate connection wires 194, the same as described with reference to FIG. 2, may be disposed on the gate contact plugs 186.

The cell vertical structures VSc, connected to each other by a connection portion 240, may be disposed on the substrate 103. The cell vertical structures VSc may pass through the gate electrodes GE, and the connection portion 240 may connect lower portions of the cell vertical structures VSc to each other.

Each of the cell vertical structures VSc may include a cell channel layer 255c passing through the gate electrodes GE, a cell core pattern 257c of which a side surface is surrounded by the cell channel layer 255c, a cell pad layer 260c on the cell core pattern 257c, and a first gate dielectric 251c interposed between the cell channel layer 255c and the gate electrodes GE while surrounding an exterior of the cell channel layer 255c.

In some embodiments, the first gate dielectric 251c may include the tunnel dielectric layer 148, the data storage layer 147, and the blocking dielectric layer 146, in the same manner as the first gate dielectric 151c described with reference to FIG. 2.

In some embodiments, the second gate dielectric 169 may be disposed between the gate electrodes GE and the cell vertical structures VSc, the same as described with reference to FIG. 2.

The connection portion 240 may be formed, as the cell channel layer 255c in the cell vertical structures VSc, the cell core pattern 257c, and the first gate dielectric 251c are continuously extended from a direction parallel to the surface 103s of the substrate 103 from a lower portion of the cell vertical structures VSc.

The connection portion 240 may be disposed in a lower gate 206 located between the substrate 103 and the gate electrodes GE. A base insulating layer 204 may be disposed between the lower gate 206 and the substrate 103. One among the cell vertical structures VSc, connected to each other by the connection portion 240, may be electrically connected to a source line 292a by a source contact plug 288a, while the other one may be electrically connected to a bit line 292b by a bit line plug 288b. An insulating separation structure 291, passing through the gate electrodes GE, may be disposed on the connection portion 240.

Dummy vertical structures VSd may include a first dummy vertical structure VSd1, a second dummy vertical structure VSd2, and a third dummy vertical structure VSd3. The first dummy vertical structure VSd1 may pass through the lower pad region P_L. The second dummy vertical structure VSd_2 may pass through the intermediate pad region P_M and the lower gate electrode GE_L below the intermediate pad region P_M. The third dummy vertical structure VSd_3 may pass through the upper pad region P_U and the intermediate gate electrode GE_M and the lower gate electrodes GE_L below the upper pad region P_U.

On the connection region 22, each of the dummy vertical structures VSd may include a buffer region 182, a dummy channel layer 255d, a dummy gate dielectric 251d, and a dummy core pattern 257d. A bottom of the dummy vertical structures VSd may be disposed in the lower gate 206. The dummy core pattern 257d may be extended to an interior of the lower gate 206 while passing through the gate electrodes GE. The dummy core pattern 257d may be formed of the same material as the cell core pattern 257c, for example, silicon oxide. The dummy gate dielectric 251d may cover a side surface and a bottom of the dummy core pattern 257d, and may be formed of a material the same as that of the first gate dielectric 251c. The dummy channel layer 255d may be formed of the same material as that of the cell channel layer 255c, for example, a semiconductor material such as silicon, or the like. The dummy channel layer 255d may be disposed between a bottom of the dummy core pattern 257d and the dummy gate dielectric 251d, and may be extended between a side surface of the dummy core pattern 257d and the dummy gate dielectric 251d.

The buffer region 182 may have the same material as that of the buffer region 182 described with reference to FIG. 2. For example, the buffer region 182 may include an upper portion 182U disposed on the dummy core pattern 257d and a lower portion 182L extended to a lower portion from an edge of the upper portion 182U and extended between the dummy core pattern 257d and the dummy gate dielectric 251d. A boundary between the lower portion 182L of the buffer region 182 and the dummy channel layer 255d may be the same as boundaries B1, B2, and B3 between the lower portion 182L of the buffer region 182 and the dummy channel layer 155d, described with reference to FIG. 2.

Figure 9B:
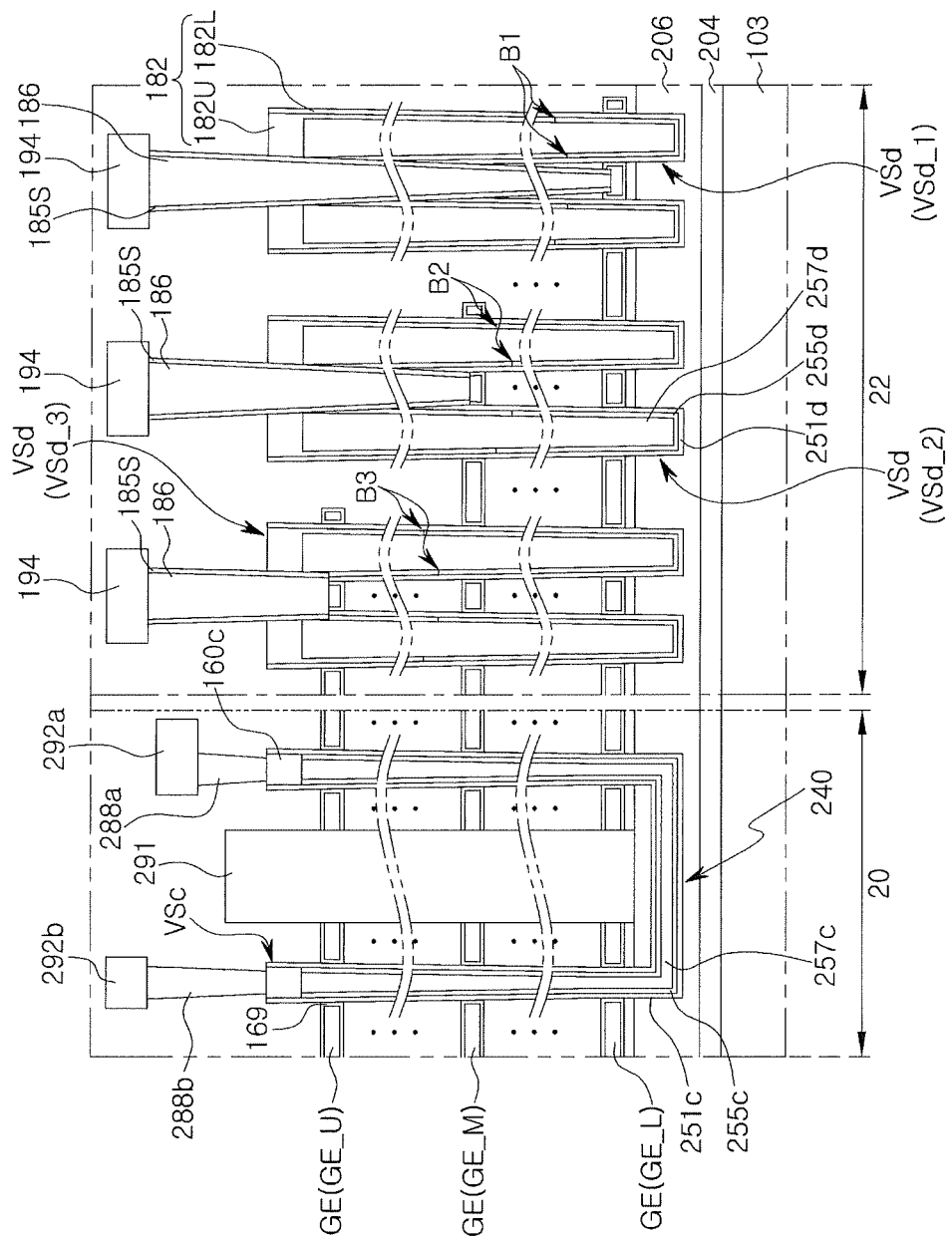
FIG. 9B is a cross section conceptually illustrating a modified example of a three-dimensional semiconductor device according to some embodiments of the present inventive concept.

In some embodiments, as illustrated in FIG. 9B, the buffer spacers 185S may be disposed on side walls of the gate contact plugs 186. The buffer spacers 185S may be extended from buffer regions 182 of the dummy vertical structures VSd to side walls of the gate contact plugs 186. The buffer spacers 185S may be integrally formed with the buffer regions 182.

Figure 10:
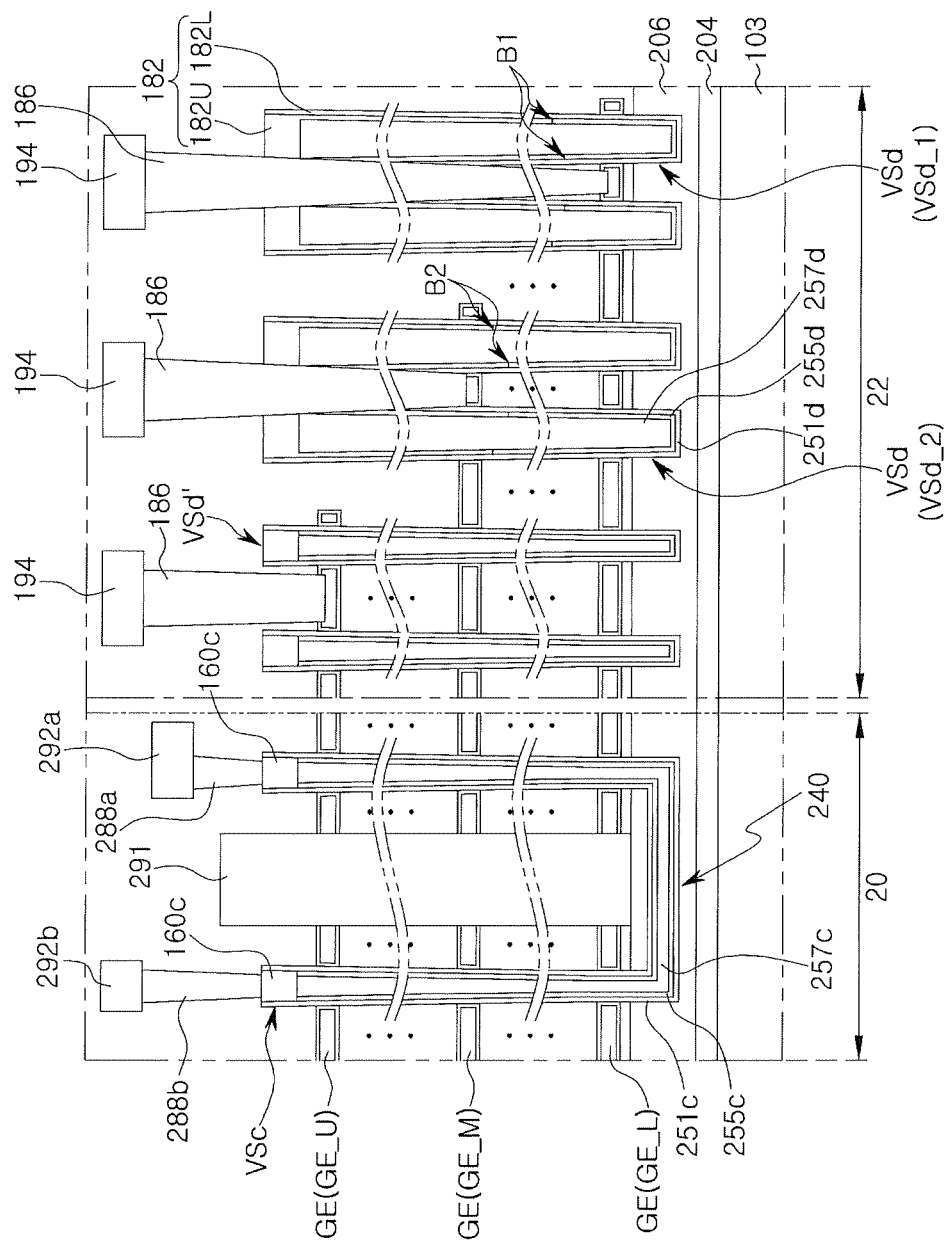
FIG. 10 is a cross section conceptually illustrating a modified example of a three-dimensional semiconductor device according to some embodiments of the present inventive concept.

In some embodiments, as illustrated in FIG. 10, among the dummy vertical structures VSd, as described with reference to FIG. 9A, the first dummy vertical structure VSd_1 and the second dummy vertical structure VSd_2 may have greater widths than that of the cell vertical structures VSc. Moreover, among the dummy vertical structures VSd, the third dummy vertical structure (VSd_3 of FIG. 9A) may be deformed to a third dummy vertical structure VSd', having a narrower width than that of each of the first dummy vertical structure VSd_1 and the second dummy vertical structure VSd_2. The third dummy vertical structure VSd', having been deformed, may be formed to have the same structure, the same material, and the same size, as those of the cell vertical structures VSc, and may be spaced apart from the gate contact plugs 186. The third dummy vertical structure VSd', having been deformed, may not include the buffer region 182 in the first dummy vertical structure VSd_1 and the second dummy vertical structure VSd_2.

Next, an exemplary example of a three-dimensional semiconductor device according to some embodiments of the technical concept of the present inventive concept will be described.

Figure 11:
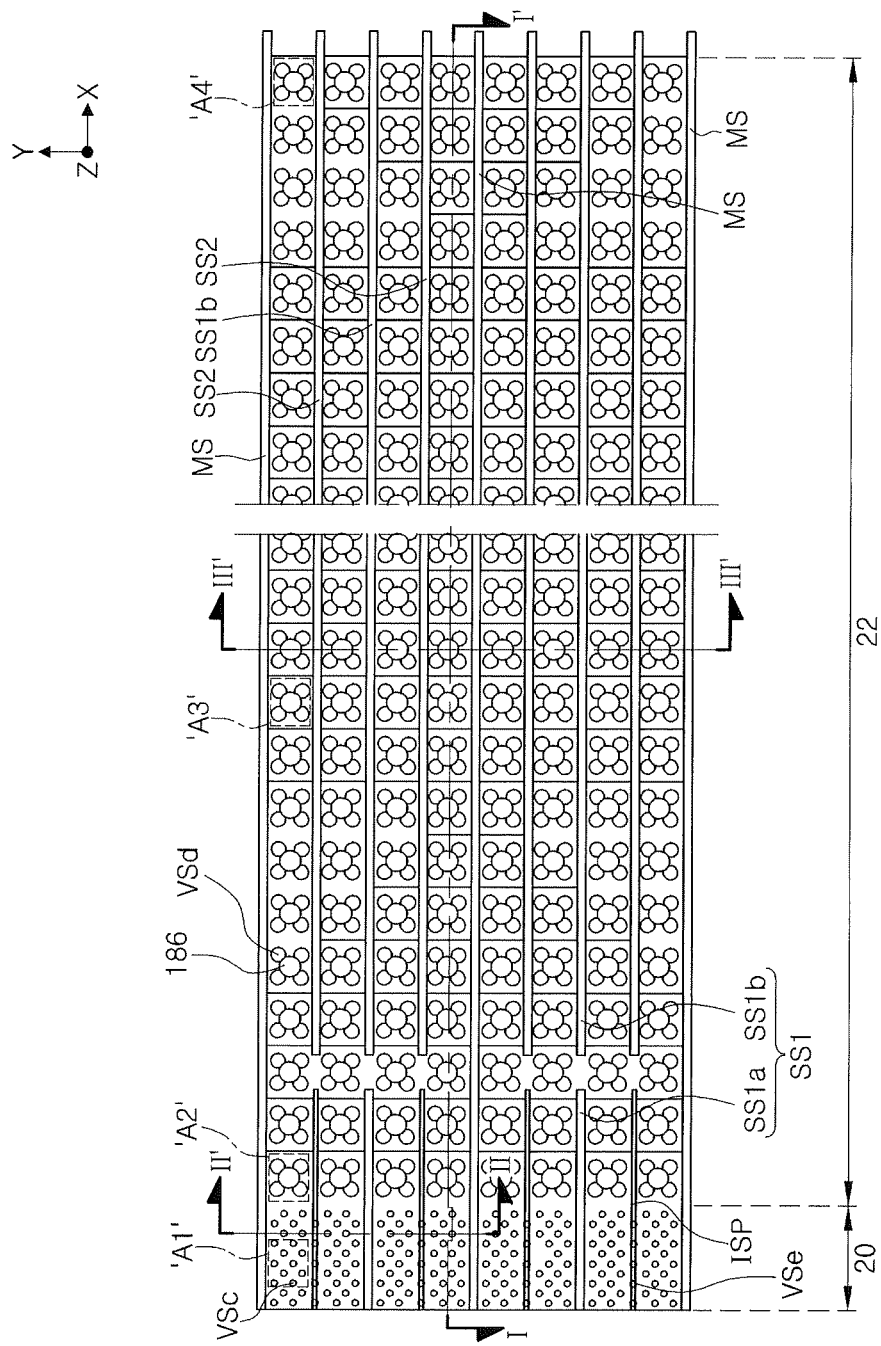
FIGS. 11 and 13 are schematic plan views illustrating an exemplary example of a three-dimensional semiconductor device according to some embodiments of the present inventive concept.
Figure 12A:
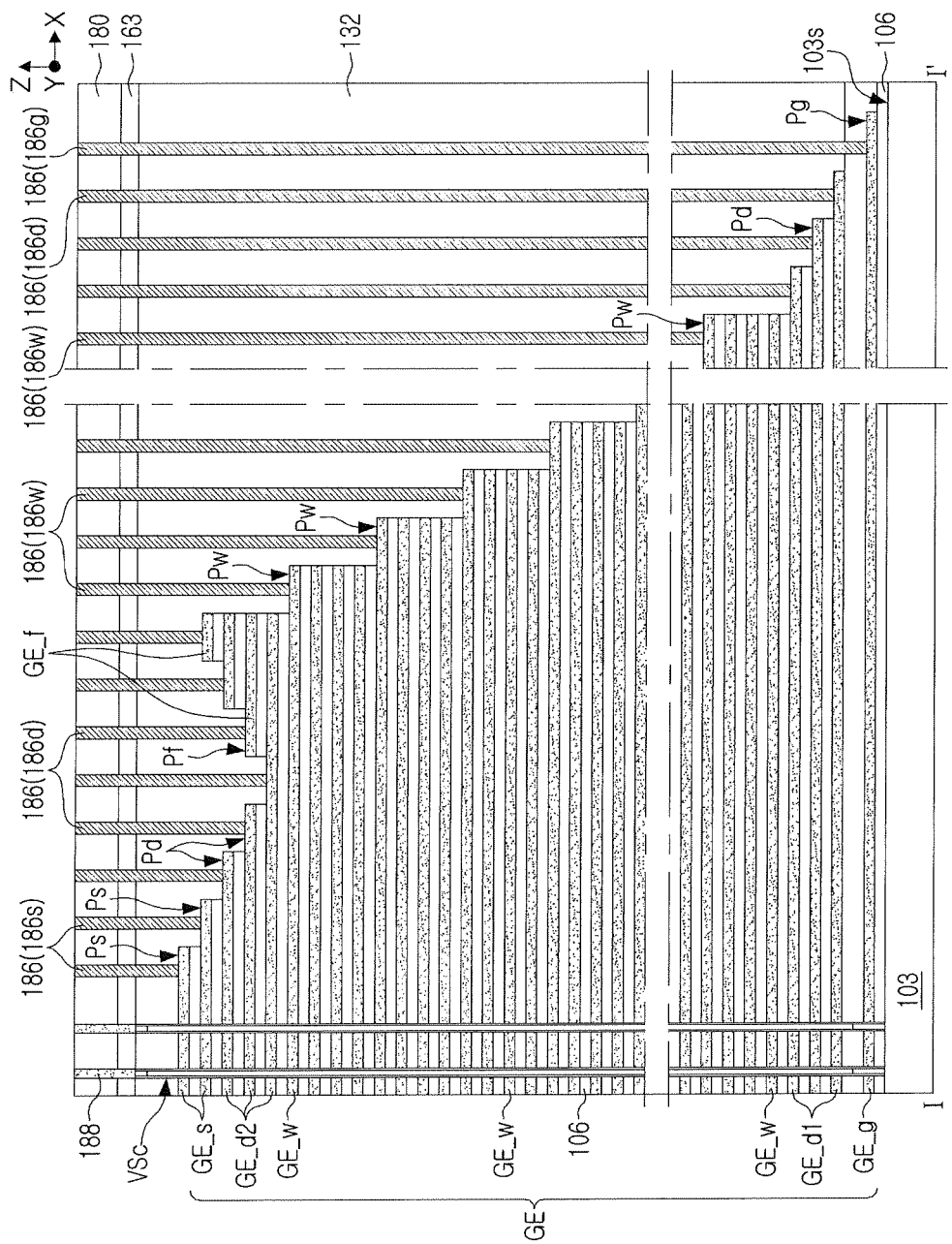
Figure 12B:
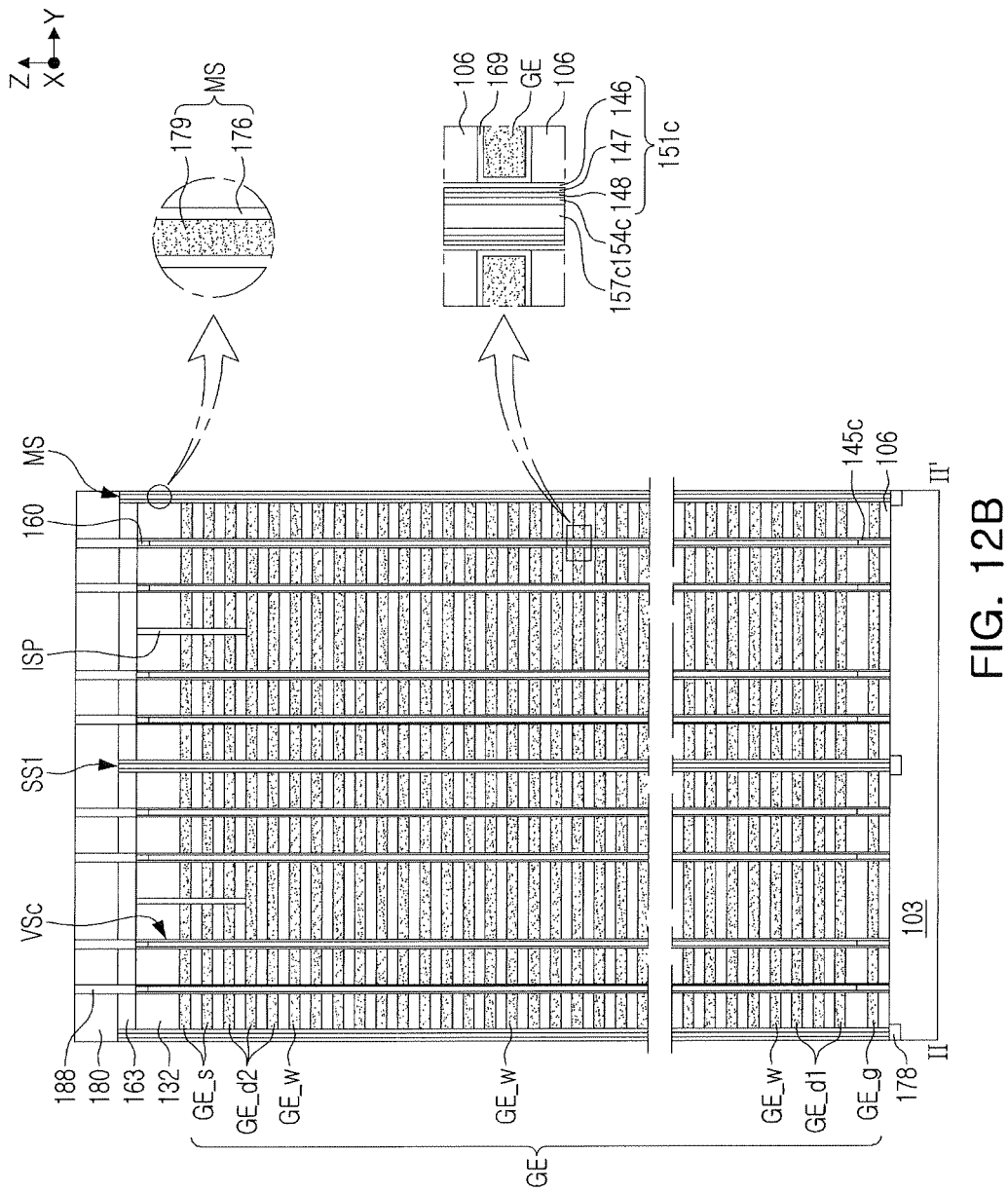
Figure 13:
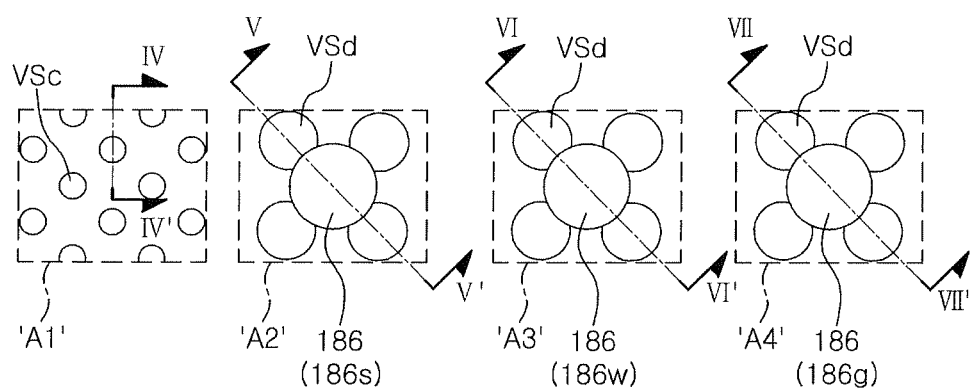
Figure 14:
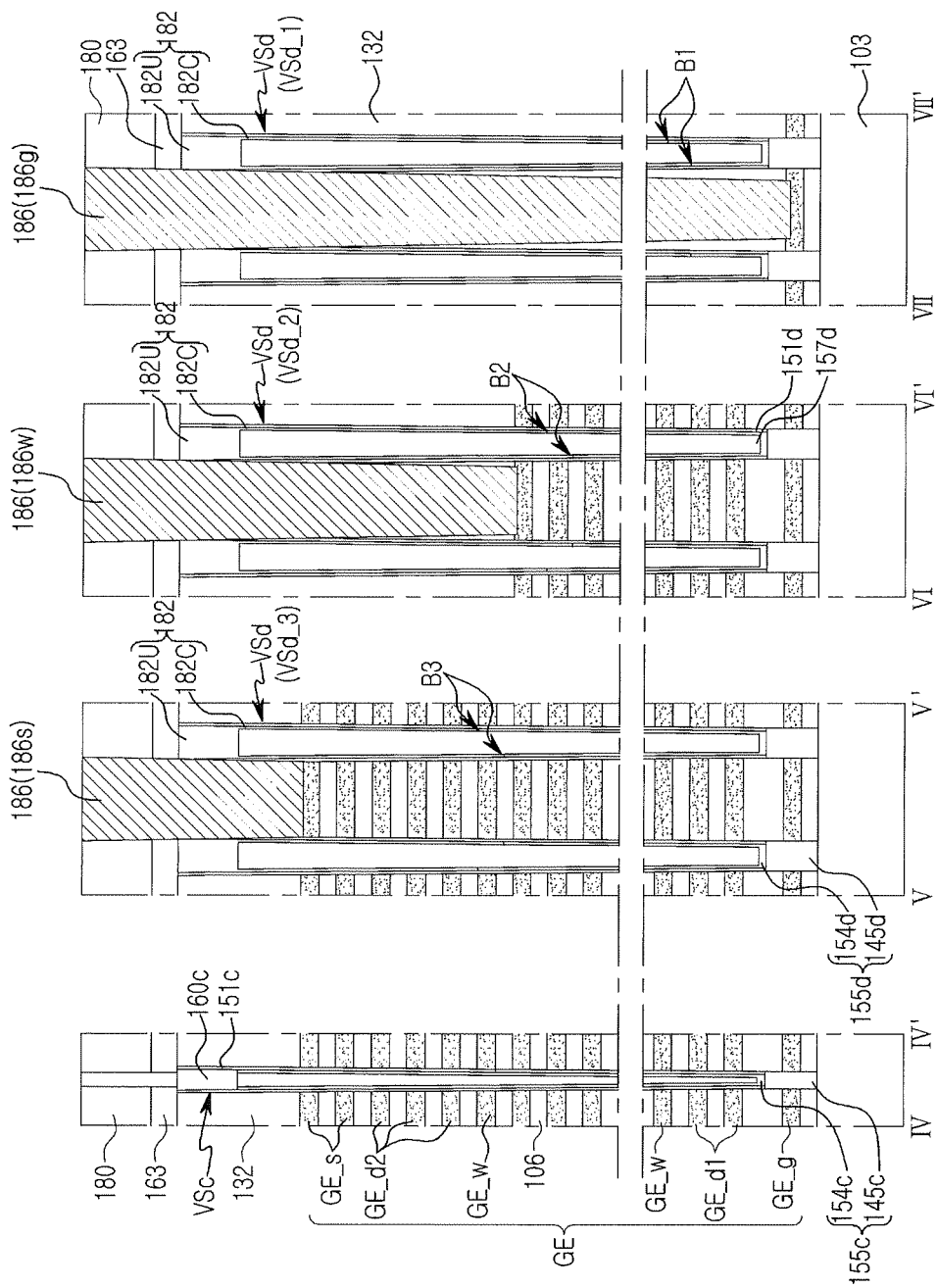

FIG. 11 is a plan view conceptually illustrating an example of a three-dimensional semiconductor device according to some embodiments, FIG. 12A is a cross section of a region taken along line I-I' of FIG. 11, FIG. 12B is a cross section of a region taken along line II-II' of FIG. 11, and FIG. 12C is a cross section of a region taken along line III-III' of FIG. 11. FIG. 13 is a plan view, in which a region indicated by 'A1' of FIG. 11, a region indicated by 'A2', a region indicated by 'A3', and a region indicated by 'A4' are enlarged, while FIG. 14 is a cross section in which a region taken along line IV-IV' of FIG. 13, a region taken along line V-V', a region taken along line VI-VI', and a region taken along line VII-VII' are illustrated.

Referring to FIGS. 11, 12A through 12C, 13, and 14, a substrate 103 having a memory cell array region 20 and a connection region 22 may be provided. The substrate 103 may be a semiconductor substrate formed of a semiconductor material such as silicon, or the like. The substrate 103 may be a bulk silicon substrate or SOI substrate.

Main separation structures MS, traversing the memory cell array region 20 and the connection region 22, may be disposed on the substrate 103. A plurality of auxiliary separation structures may be disposed between the main separation structures MS. The main separation structures MS may have a shape of a line extended in a first direction X. Each of the plurality of auxiliary separation structures may have a line shape or a bar shape, extended in the first direction X. Each of the plurality of auxiliary separation structures may have a line shape or a bar shape having a shorter length that those of the main separation structures MS. The plurality of auxiliary separation structures may include first auxiliary separation structure SS1, and second auxiliary separation structure SS2. The first auxiliary separation structure SS1 may include a first line portion SS1a and a second line portion SS1b, having end portions opposing each other. The first line portion SS1a of the first auxiliary separation structure SS1 may be extended to a portion of the connection region 22 while traversing the memory cell array region 20, while the second line portion SS1b of the first auxiliary separation structure SS1 is disposed in the connection region 22 and may have an end portion opposing an end portion of the first line portion SS1a. The second auxiliary separation structures SS2 may be disposed between the second line portion SS1b of the first auxiliary separation structure SS1 and the main separation structures MS. The main separation structures MS, as well as the first auxiliary separation structure SS1 and the second auxiliary separation structure SS2 may have a line shape, extended in the first direction X, parallel to the surface 103s of the substrate 103.

Gate electrodes GE may be disposed on the substrate 103 between the main separation structures MS. The gate electrodes GE may be formed of a conductive material including at least one among doped polysilicon, metal nitride (e.g., TiN), metal silicide (e.g., WSi, TiSi, TaSi, or the like) or a metal (e.g., W). The doped polysilicon may be polysilicon including an N-type impurity (e.g., P, As, or the like) or a P-type impurity (e.g., B, or the like).

The gate electrodes GE are spaced apart from each other while being sequentially stacked on the memory cell array region 20 in a direction Z, perpendicular to the surface 103s of the substrate 103, and may be extended to the connection region 22. The gate electrodes GE may be spaced apart from each other by interlayer insulating layers 106 while being arranged in a direction Z, perpendicular to the surface 103s of the substrate 103. A lowermost interlayer insulating layer, among the interlayer insulating layers 106, may be interposed between a lowermost gate electrode, among the gate electrodes GE, and the substrate 103.

The gate electrodes GE may include a plurality of lower gate electrodes GE_g and GE_d1, a plurality of intermediate gate electrodes GE_w disposed on the plurality of lower gate electrodes GE_g and GE_d1, and a plurality of upper gate electrodes GE_s and GE_d2 disposed on the plurality of intermediate gate electrodes GE_w.

In some embodiments, the plurality of lower gate electrodes GE_g and GE_d1 may be disposed in plural. The plurality of lower gate electrodes GE_g and GE_d1 may include a lower select gate electrode GE_g and one or a plurality of lower dummy gate electrodes GE_d1 disposed on the lower select gate electrode GE_g. The lower select gate electrode GE_g may be a ground select line (GSL of FIG. 1) described with reference to FIG. 1. The plurality of intermediate gate electrodes GE_w may be the word lines (WLs of FIG. 1) described with reference to FIG. 1.

In some embodiments, the plurality of upper gate electrodes GE_s, GE_d2 may be disposed in plural. Among the plurality of upper gate electrodes GE_s and GE_d2, an uppermost upper gate electrode and/or a next uppermost gate electrode may be an upper select gate electrode GE_s, and one or a plurality of upper gate electrodes, located between the upper select gate electrode GE_s and the plurality of intermediate gate electrodes GE_w, may be an upper dummy gate electrode GE_d2. The upper select gate electrode GE_s may be the string select lines (SSL of FIG. 1) described with reference to FIG. 1.

In some embodiments, among the gate electrodes GE, an uppermost upper gate electrode GE_s may correspond to the upper gate electrode (GE_U of FIG. 2) described with reference to FIG. 2, the lowermost upper gate electrode GE_g may correspond to the lower gate electrode (GE_L of FIG. 2) described with reference to FIG. 2, and one intermediate gate electrode, among the intermediate gate electrodes GE_w, may correspond to the intermediate gate electrode GE_M described with reference to FIG. 2.

In the first auxiliary separation structure SS1, the first line portion SS1a may traverse the upper select gate electrode GE_s, while the second line portion SS1b may be spaced apart from the upper select gate electrode GE_s. In some embodiments, the second auxiliary separation structures SS2 may be spaced apart from the upper select gate electrode GE_s.

In the connection region 22, floating dummy gate electrodes GE_f, disposed on the plurality of intermediate gate electrodes GE w and opposing a portion of the upper gate electrodes GE_s and GE_d2, may be disposed therein. The floating dummy gate electrodes GE_f may be formed of a material the same as that of the gate electrodes GE. The floating dummy gate electrodes GE_f may include floating pad regions Pf arranged to have a stepped shape, sequentially lowered in a direction toward the upper gate electrodes GE_s and GE_d2. The floating dummy gate electrodes GE_f may be spaced apart from the memory cell array region 20.

The gate electrodes GE may be disposed between the main separation structures MS. The main separation structures MS may be understood to pass through the gate electrodes while traversing the gate electrodes GE. The gate electrodes GE may be penetrated by the first auxiliary separation structure SS1 and the second auxiliary separation structure SS2 between the main separation structures MS.

Each of the main separation structures MS, as well as the first auxiliary separation structure SS1 and the second auxiliary separation structure SS2 may include a conductive pattern 179 and a spacer 176 covering a side surface of the conductive pattern 179. The spacer 176 may be formed of an insulating material such as silicon oxide or silicon nitride. The spacer 176 may allow the conductive pattern 179 and the gate electrodes GE to be spaced apart from each other. The conductive pattern 179 may be formed of a conductive material including at least one among doped polysilicon, a metal nitride such as titanium nitride, or the like, or a metal such as tungsten or the like. In some embodiments, the conductive pattern 179 may be referred to as a source contact plug.

Impurity regions 178 may be disposed in the substrate 103 below the main separation structures MS, as well as the first auxiliary separation structure SS1 and the second auxiliary separation structure SS2. The impurity regions 178 may be a common source line. The impurity regions 178 may have N-type conductivity, while a portion of the substrate 103, adjacent to the impurity regions 178, may have P-type conductivity.

Insulating line patterns ISP, traversing the upper select gate electrode GE_s, and separating the upper select gate electrode GE_s in a longitudinal direction of the main and auxiliary separation structures MS, SS1, and SS2, that is, in the first direction X, may be provided. The insulating line patterns ISP may be disposed on a level higher than that of the plurality of intermediate gate electrodes GE_w. End portions of the insulating line patterns ISP may oppose end portions of the second auxiliary separation structures SS2. The insulating line patterns ISP may be formed of silicon oxide.

In some embodiments, the insulating line patterns ISP may be interposed between the first line portion SS1a of the first auxiliary separation structure SS1 and the main separation structures MS while having a line shape extended in the first direction X.

In some embodiments, the second auxiliary separation structures SS2 may be spaced apart from the upper select gate electrode GE_s.

The gate electrodes GE may have pad regions three-dimensionally arranged on the connection region 22. As described above, the pad regions are three-dimensionally arranged, so a semiconductor device may be highly integrated.

The upper select gate electrode GE_s may include upper select pad regions Ps, and the upper dummy gate electrode GE_d2 may include upper dummy pad regions Pd2. The upper select pad regions Ps and the upper dummy pad regions Pd2 may form upper pad regions Ps and Pd of the upper gate electrodes GE_s and GE_d2. The upper pad regions Ps and Pd may be lowered sequentially in the first direction X away from the memory cell array region 20.

Among the lower gate electrodes GE_g and GE_d1, the lower select gate electrode GE_g may include a lower select pad region Pg, and the lower dummy gate electrodes GE_d1 may include lower dummy pad regions Pd1.

The floating dummy gate electrodes GE_f may include floating dummy pad regions Pf. The floating dummy pad regions Pf may be arranged in a stepped shape lowered in a direction toward the memory cell array region 20. The plurality of intermediate gate electrodes GE_w may include intermediate pad regions Pw. The intermediate pad regions Pw may be arranged in a stepped shape lowered by a first stepped portion in the first direction X to the connection region 22 from the memory cell array region 20, and a stepped shape lowered sequentially by a second stepped portion, smaller than the first stepped portion, in a second direction Y perpendicular to the first direction X.

In some embodiments, the lower pad region (P_L of FIG. 2), described with reference to FIG. 2, may correspond to the lower select pad region Pg, the intermediate pad region (P_M of FIG. 2) may correspond to one among the intermediate pad regions Pw, and the upper pad region (P_U of FIG. 2) may correspond to the upper select pad region Ps.

A first insulating layer 132, a second insulating layer 163, and a third insulating layer 180, sequentially stacked while covering the gate electrodes GE, may be disposed on the substrate 103. In some embodiments, the separation structures MS, SS1, and SS2 may pass through the gate electrodes GE while passing through the first insulating layer 132 and the second insulating layer 163.

The cell vertical structures VSc may be disposed on the memory cell array region 20, and the dummy vertical structures VSd may be disposed on the connection region 22.

The cell vertical structures VSc and the dummy vertical structures VSd may pass through the gate electrodes GE while passing through the first insulating layer 132.

The cell vertical structures VSc may include the first gate dielectric 151c, the cell channel layer 155c, the cell core pattern 157c, and the cell pad layer 160c, the same as those described with reference to FIG. 2, while the dummy vertical structures VSd may include the dummy gate dielectric 151d, the dummy channel layer 155d, and the buffer region 182, the same as those described with reference to FIG. 2. Thus, the cell vertical structures VSc and the dummy vertical structures VSd may be the same as the cell vertical structures and the dummy vertical structures, described with reference to FIG. 2. Here, the detailed description thereof will be omitted.

Dummy vertical structures VSe, passing through the insulating line patterns ISP, may be disposed on the memory cell array region 20. The dummy vertical structures VSe may be formed to have the same material, the same structure, and the same size, as those of the cell vertical structures VSc.

In the memory cell array region 20, the cell vertical structures VSc may pass through the gate electrodes GE. In the connection region 22, the dummy vertical structures VSd may pass through the pad regions of the gate electrodes GE.

The gate contact plugs 186 may be disposed on pad regions of the gate electrodes GE. The gate contact plugs 186 may pass through the first insulating layer 132, the second insulating layer 163, and the third insulating layer 180.

The gate contact plugs 186 may include a lower select gate contact plug 186g electrically connected to the lower select pad region Pg of the lower select gate electrode GE_g, intermediate gate contact plugs 186w electrically connected to the intermediate pad regions Pw of the plurality of intermediate gate electrodes GE_w, an upper select gate contact plug 186s electrically connected to the upper select pad region Ps of the upper select gate electrode GE_s, and dummy gate contact plugs 186d on the lower and upper dummy pad regions Pd and the floating pad regions Pf. Bit line contact plugs 188 may be disposed on the cell vertical structures VSc.

The gate contact plugs 186 and the bit line contact plugs 188 may be substantially the same as the gate contact plugs 186 and the bit line contact plugs 188, described with reference to FIG. 2.

Figure 15:
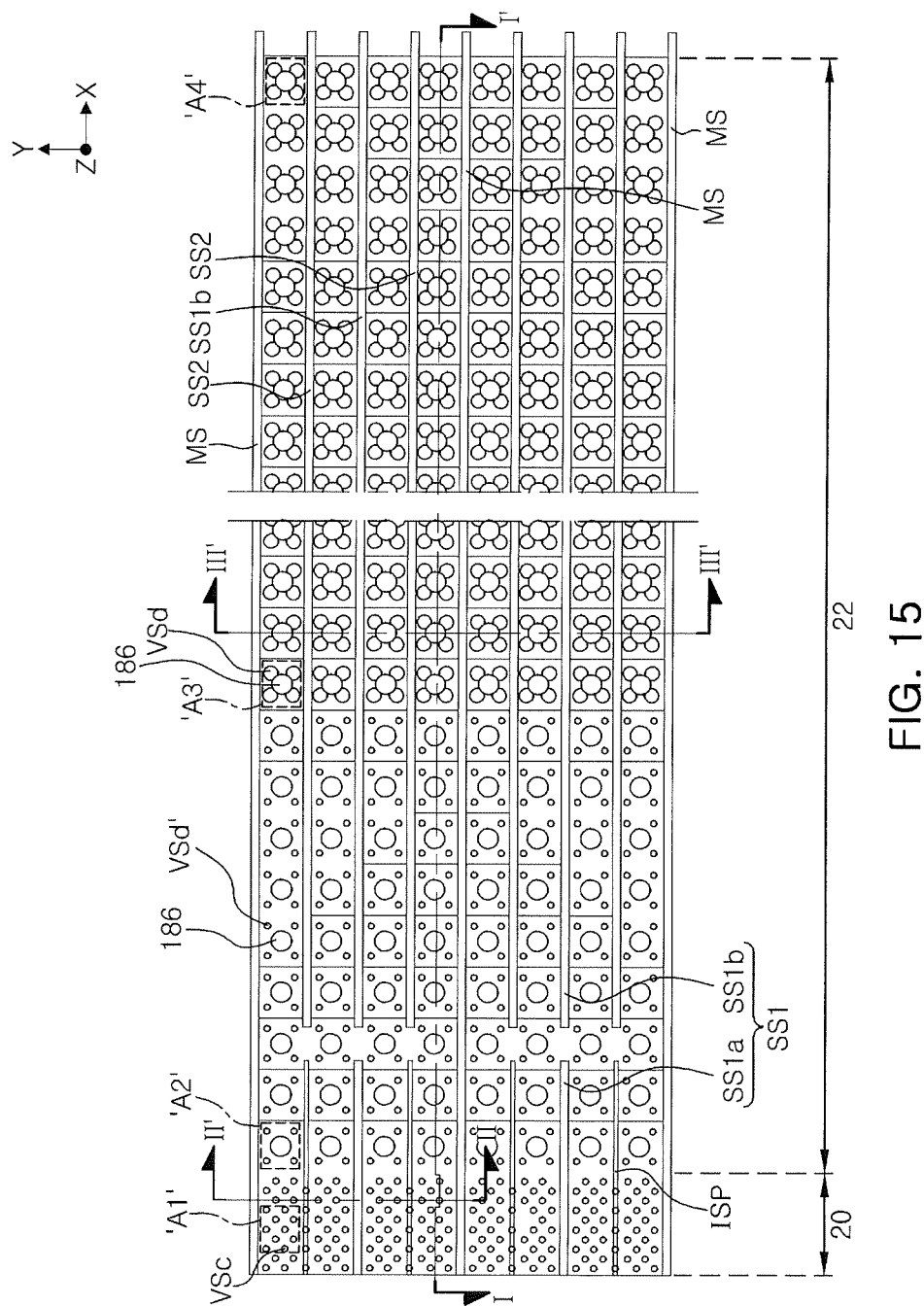
FIGS. 15 and 16 are plan views conceptually illustrating a modified example of a three-dimensional semiconductor device according to some embodiments of the present inventive concept.

Next, a modified example of a three-dimensional semiconductor device according to some embodiments will be described. FIG. 15 is a plan view conceptually illustrating a three-dimensional semiconductor device according to some embodiments modified example, FIG. 16 is a plan view in which a region indicated by 'A1' of FIG. 15, a region indicated by 'A2', a region indicated by 'A3', and a region indicated by 'A4' are enlarged, and FIG. 17 is a cross section of a region taken along line VIII-VIII' of FIG. 16, a region taken along line IX-IX', a region taken along line X-X', and a region taken along line XI-XI'.

Figure 16:
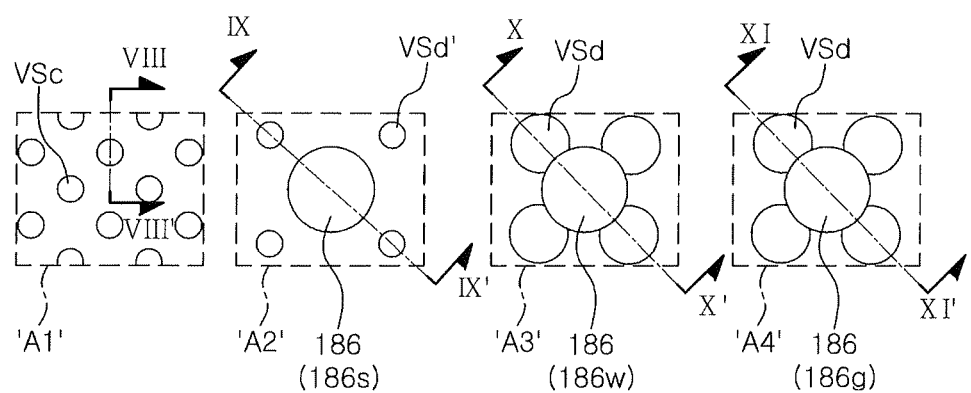
Figure 17:
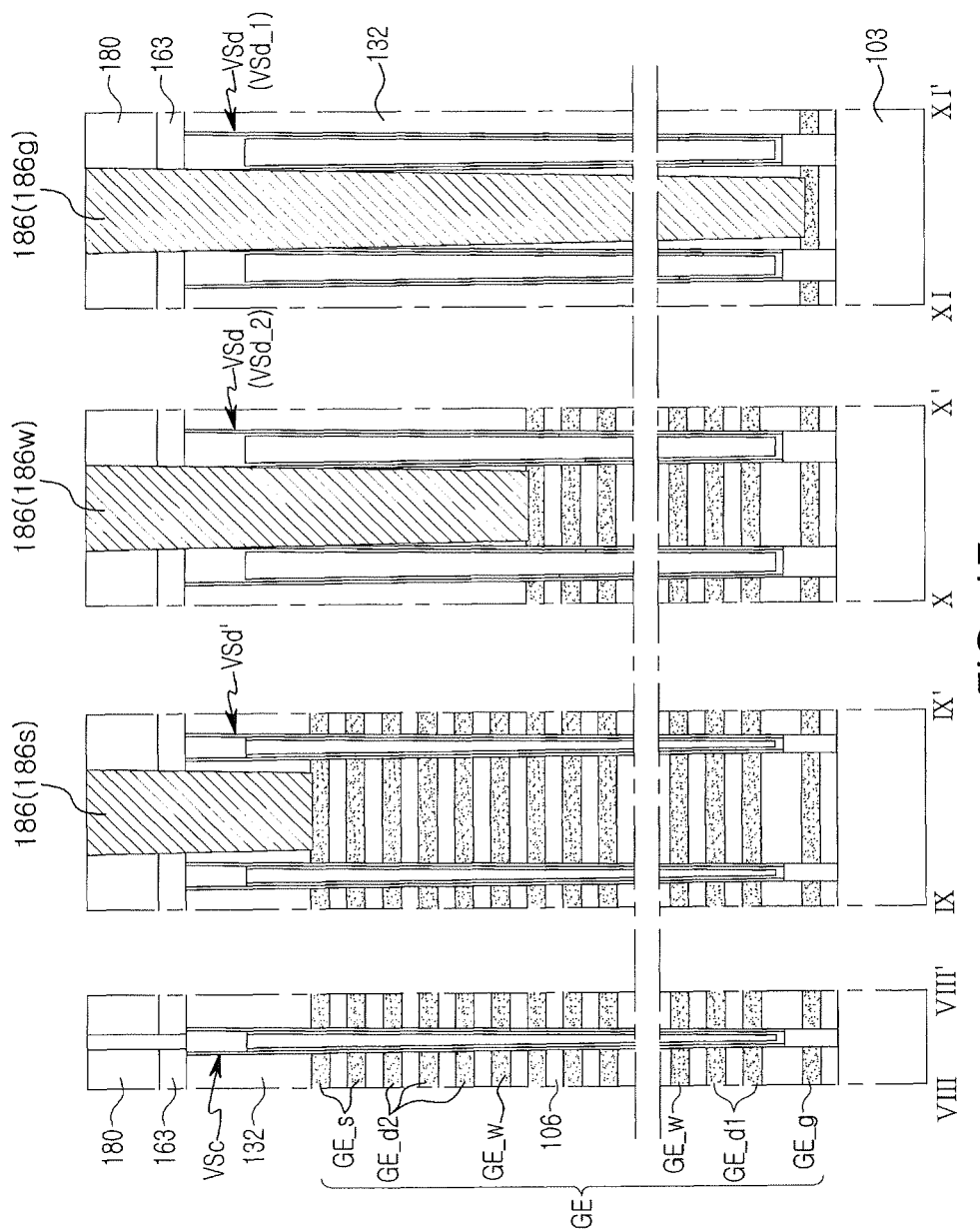
FIG. 17 is a cross section conceptually illustrating a modified example of a three-dimensional semiconductor device according to according to some embodiments of the present inventive concept.

Referring to FIGS. 15, 16, and 17, in the connection region 22, a portion of the dummy vertical structures VSd may be deformed to have the same material, the same configuration, and the same size, as those of the cell vertical structures VSc in the memory cell array region 20. As described above, dummy vertical structures VSd', of the dummy vertical structures VSd, having been deformed, may be substantially the same as the third dummy vertical structures VSd' described with reference to FIG. 3. The dummy vertical structures VSd', having been deformed, may be spaced apart from the gate contact plugs 186s and 186d adjacent to the dummy vertical structures VSd', having been deformed, in the same manner as described with reference to FIG. 3.

Processing steps in the fabrication of three-dimensional semiconductor devices according to some embodiments of the present inventive concept will be described. Among FIGS. 17A through 24, FIGS. 18A, 19A, 20A, 21A, and 22A are cross sections of a region taken along line I-I' of FIG. 11, FIGS. 18B, 19B, 20B, 21B, and 22B are cross sections of a region taken along line III-III' of FIG. 11, and FIGS. 23 through 25 are cross sections illustrating a region taken along line IV-IV', a region taken along line V-V', a region taken along line VI-VI', and a region taken along line VII-VII', of FIG. 13.

Figure 18A:
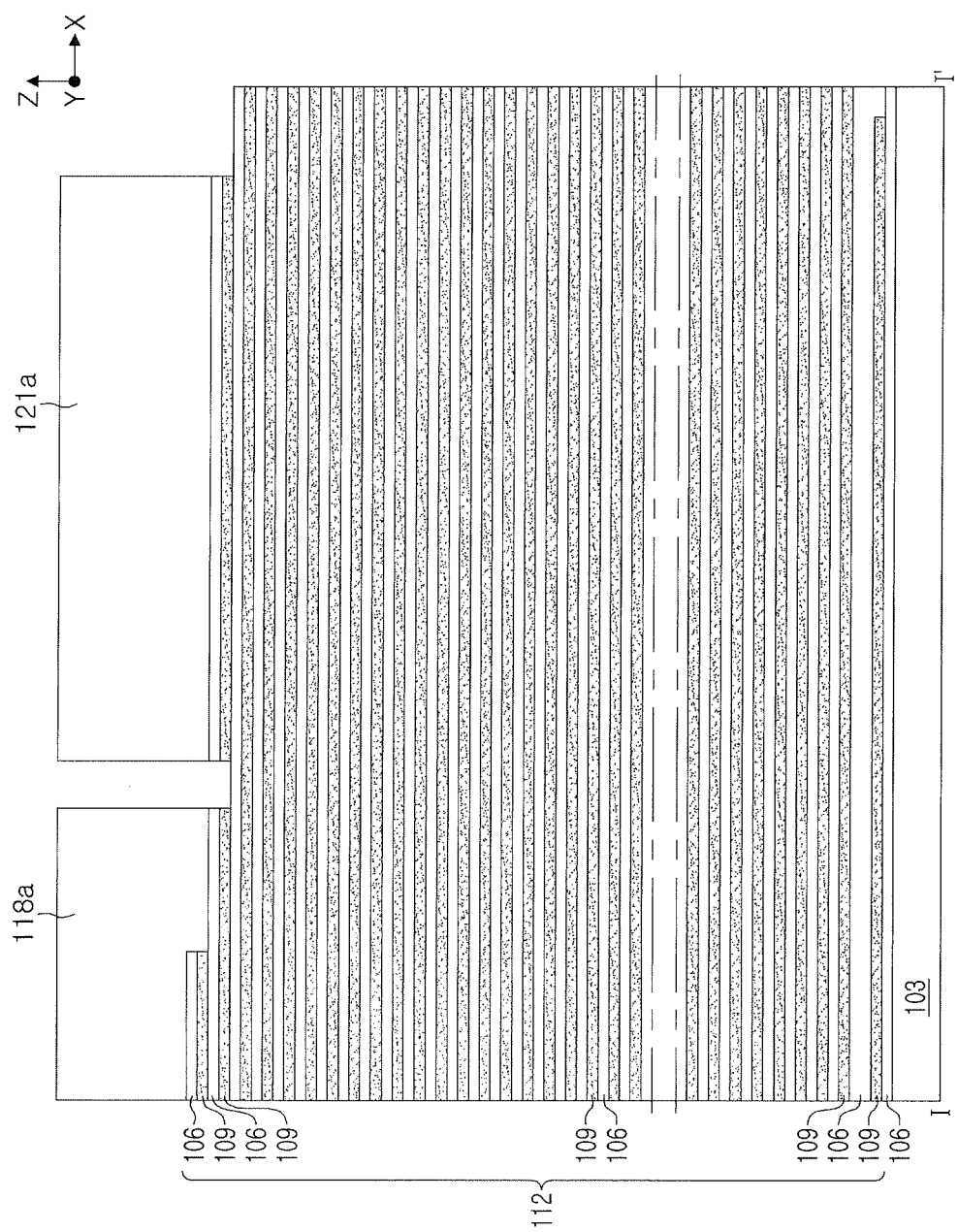
FIGS. 18A through 25 are cross sections illustrating an exemplary example of a method of forming a three-dimensional semiconductor device according to some embodiments of the present inventive concept.
Figure 18B:
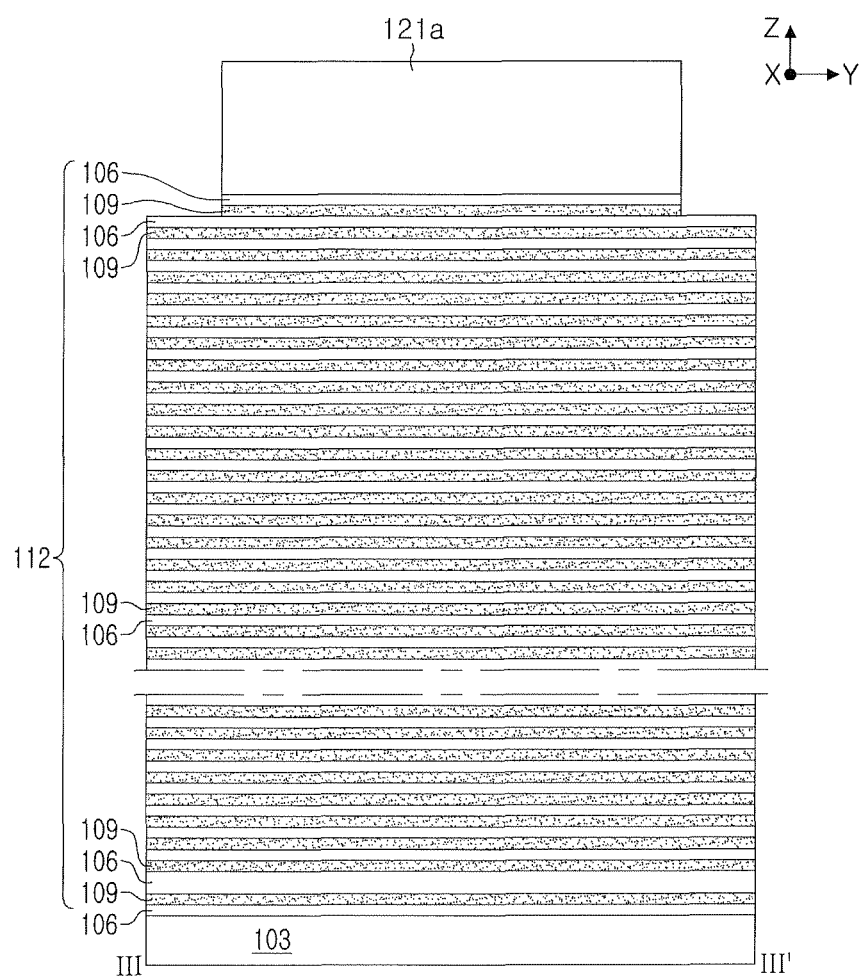

Referring to FIGS. 11, 18A, and 18B, on a substrate 103 having a memory cell array region 20 and a connection region 22, a mold structure 112 including interlayer insulating layers 106 and sacrificial layers 109 may be formed thereon. The interlayer insulating layers 106 may be formed of silicon oxide, while the sacrificial layers 109 may be formed of silicon nitride. The interlayer insulating layers 106 and the sacrificial layers 109 may be alternately and repeatedly formed, and a lowermost layer and an uppermost layer may be an interlayer insulating layer. Among the sacrificial layers 109, a sacrificial layer located at a lowermost position and a sacrificial layer located at an uppermost position may be a sacrificial layer, having been patterned. On a substrate 103, having the interlayer insulating layers 106 and the sacrificial layers 109, a first mask pattern 118a and a second mask pattern 121a, spaced apart from each other, may be formed thereon.

In some embodiments, the first mask pattern 118a may be extended to a portion of the connection region 22 while covering the entirety of the memory cell array region 20. The first mask pattern 118a may cover a sacrificial layer, among the sacrificial layers 109, having been patterned and located in an uppermost position. The second mask pattern 121a may be formed on a portion of the connection region 22. In some embodiments, the first mask pattern 118a and the second mask pattern 121a may be formed of photoresist patterns.

The first mask pattern 118a and the second mask pattern 121a are used as an etch mask, so a single interlayer insulating layer and a single sacrificial layer, among the interlayer insulating layers 106 and the sacrificial layers 109, not overlapping the first mask pattern 118a and the second mask pattern 121a, may be sequentially etched.

Figure 19A:
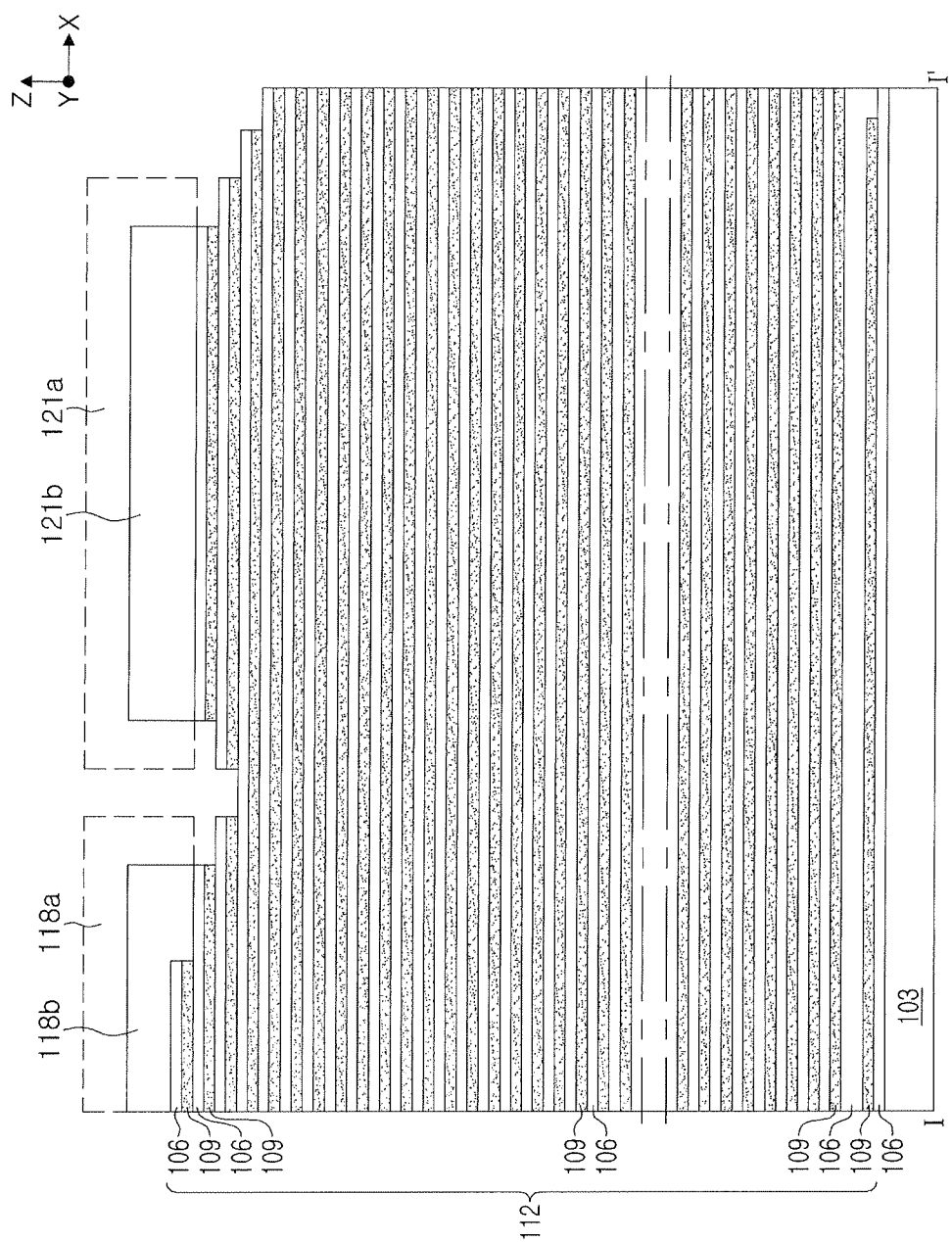
Figure 19B:
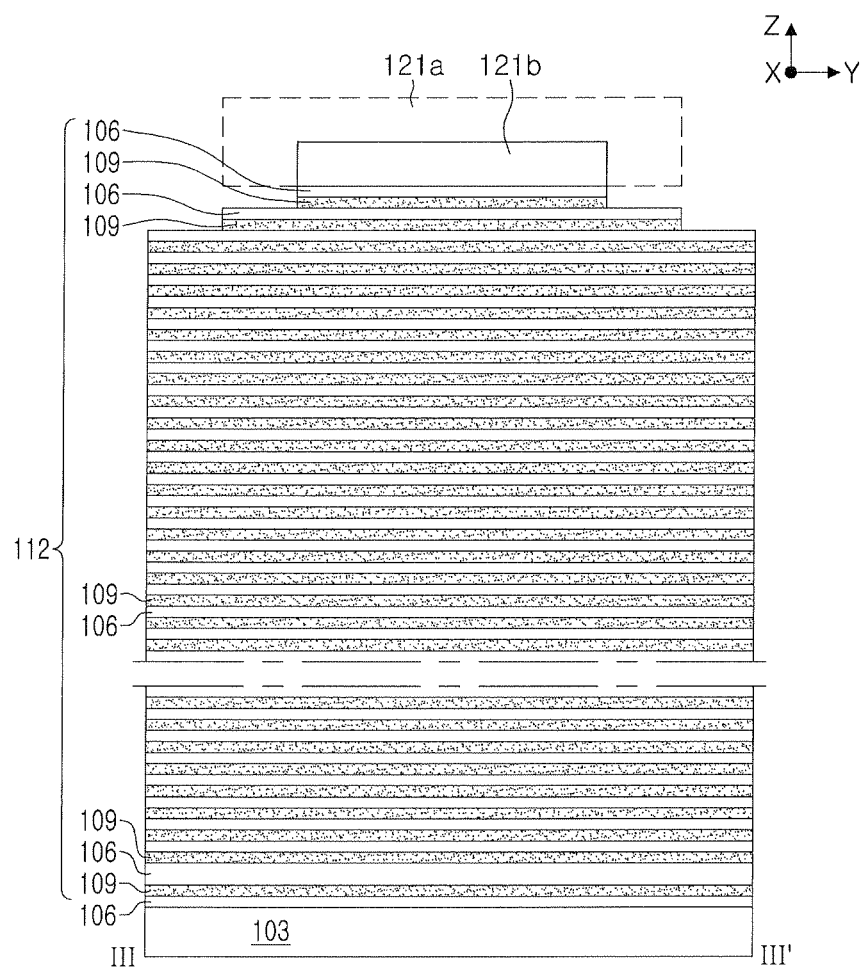

Referring to FIGS. 11, 19A, and 19B, a first trim process for reducing sizes of the first mask pattern and the second mask pattern (118a and 121a of FIGS. 18A and 18B) may be performed. The first trim process may be a partial etching or isotropic etching process for reducing sizes of the first mask pattern and the second mask pattern (118a and 121a of FIGS. 18A and 18B) in a direction parallel to a surface of the substrate 103. Thus, a first mask pattern 118b and a second mask pattern 121b, of which sizes are reduced using the first trim process, are used, so a single interlayer insulating layer and a single sacrificial layer, among the interlayer insulating layers 106 and the sacrificial layers 109, not overlapping the first mask pattern 118b and the second mask pattern 121b, may be sequentially etched.

Figure 20A:
Figure 20B:
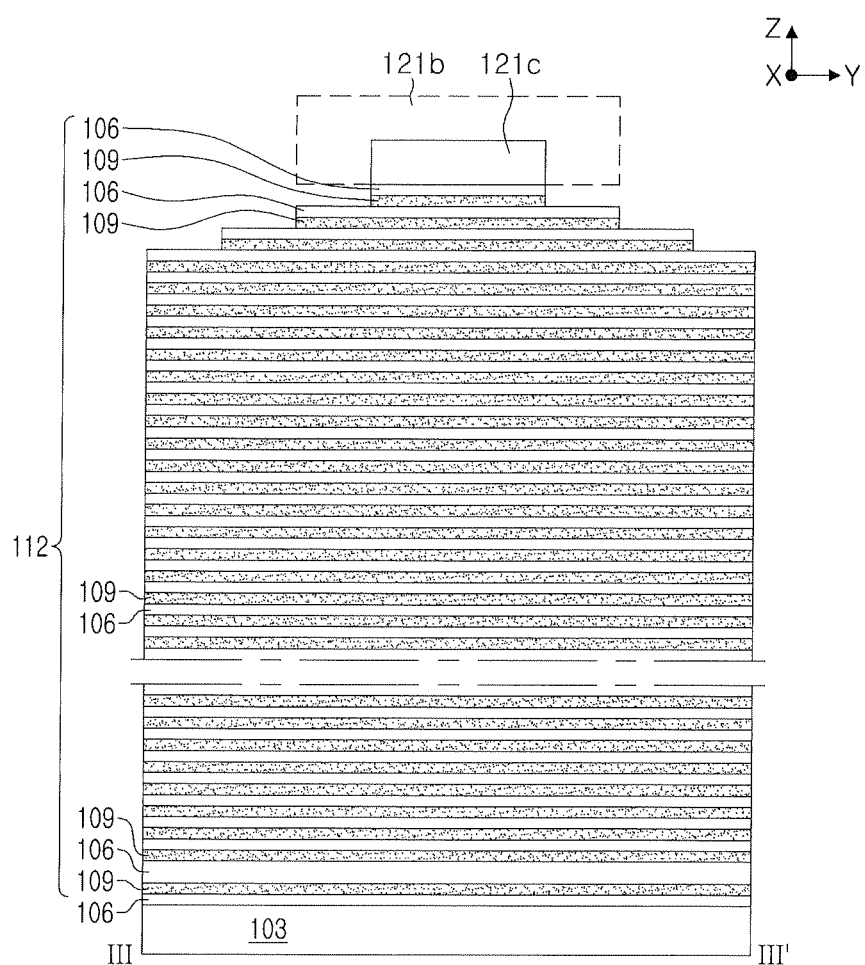

Referring to FIGS. 11, 20A, and 20B, a second trim process for further reducing sizes of the first mask pattern and the second mask pattern (118b and 121b of FIGS. 19A and 19B) may be performed. The second trim process may be a partial etching or isotropic etching process for reducing sizes of the first mask pattern and the second mask pattern (118b and 121b of FIGS. 19A and 19B) in a direction parallel to a surface of the substrate 103. Thus, the first mask pattern 118c and the second mask pattern 121c, of which sizes are reduced using the second trim process, are used, so a single interlayer insulating layer and a single sacrificial layer, among the interlayer insulating layers 106 and the sacrificial layers 109, not overlapping the first mask pattern 118c and the second mask pattern 121c, may be sequentially etched.

Figure 21A:
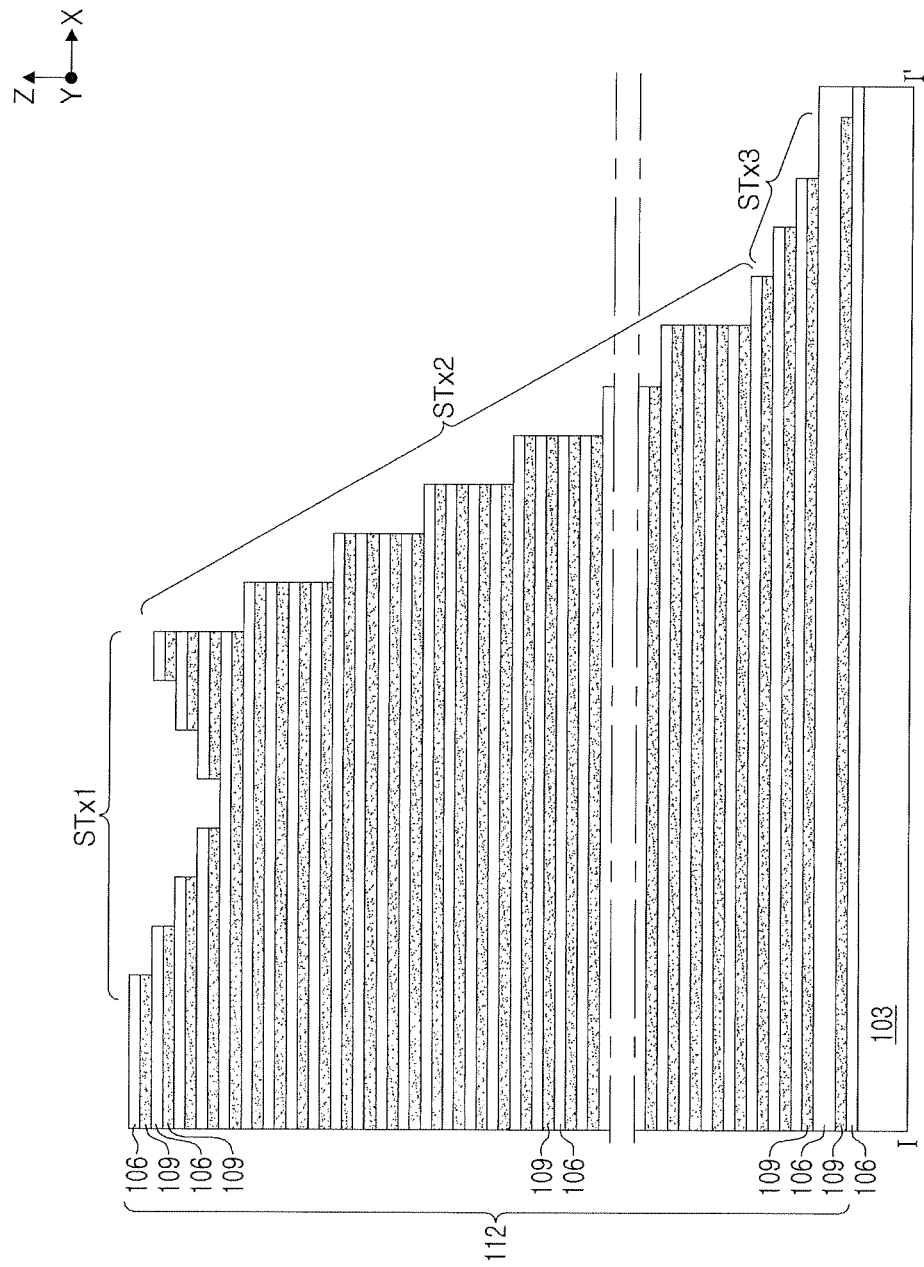
Figure 21B:
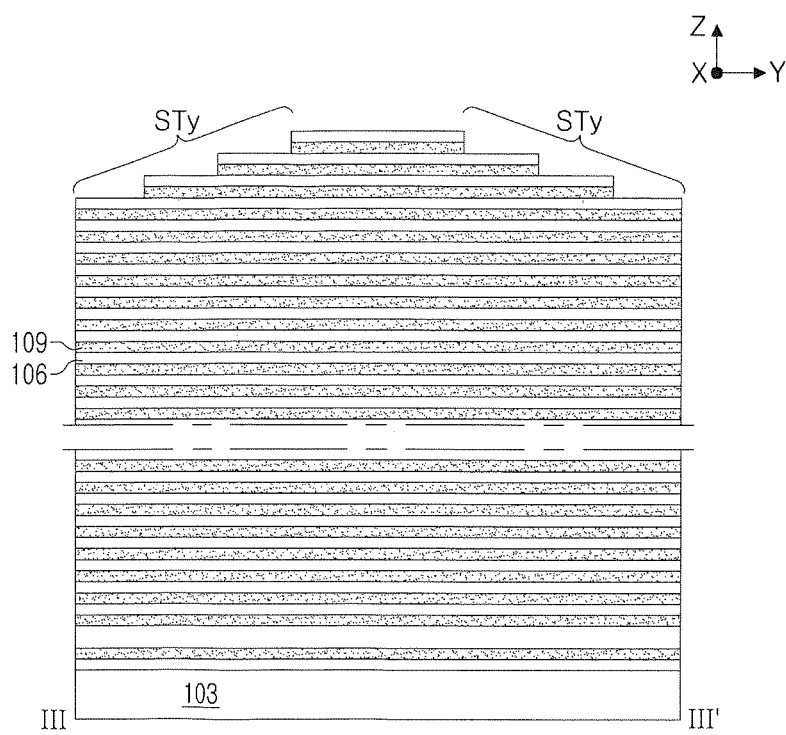

Referring to FIGS. 11, 21A, and 21B, after the first mask pattern and the second mask pattern (118c and 121c of FIGS. 21A and 20B) are removed, a staircase portion formation process for forming staircase portions, lowered by a constant height, in a region in which the second mask pattern 121c is removed is undertaken. Thus, staircase portions STx2, lowered by a first stepped portion in the first direction X, staircase portions STx1 and STx3 lowered by a second stepped portion smaller than the first stepped portion in the first direction X, and staircase portions Sty lowered by the second stepped portion in a second direction Y perpendicular to the first direction X.

Figure 22A:
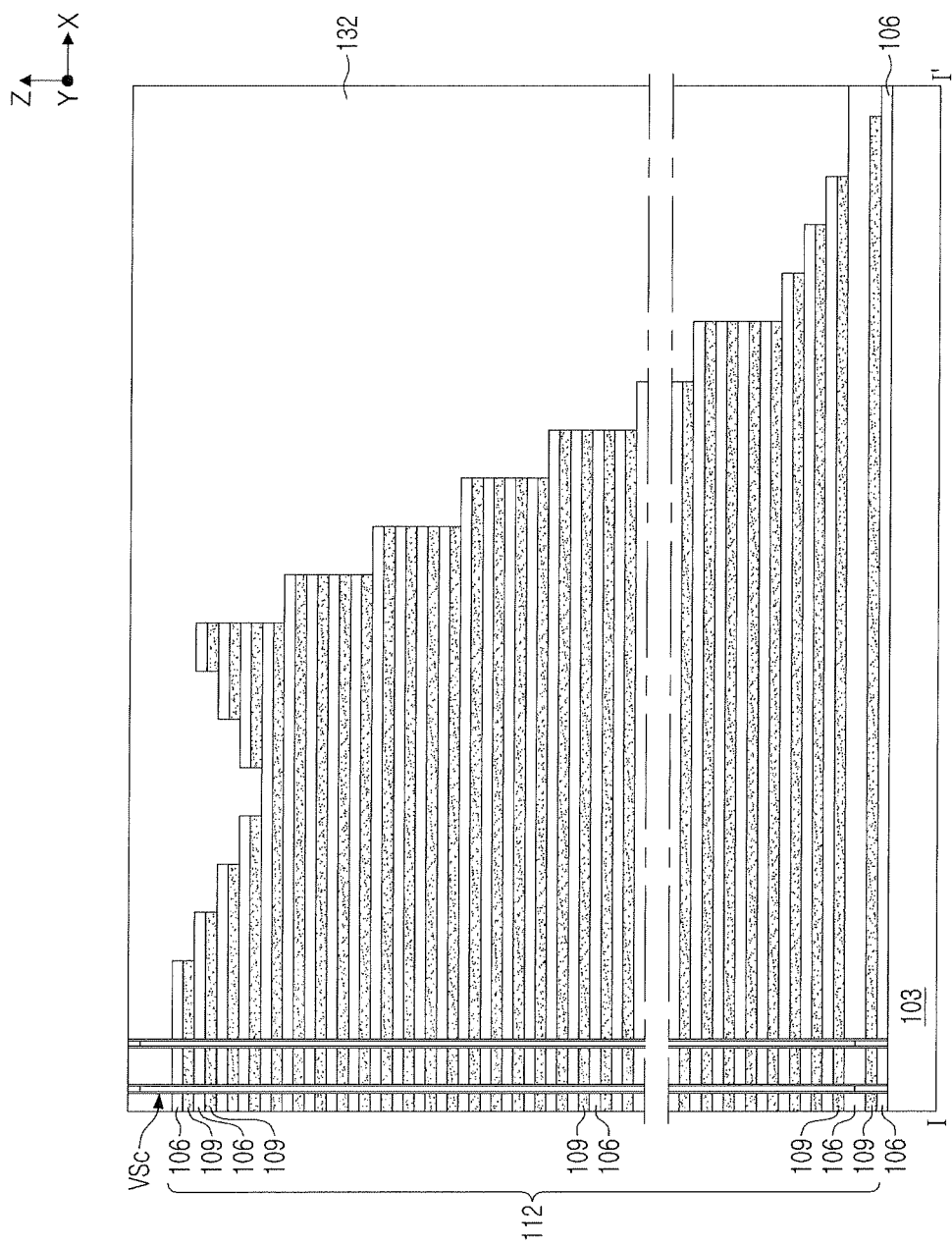
Figure 22B:
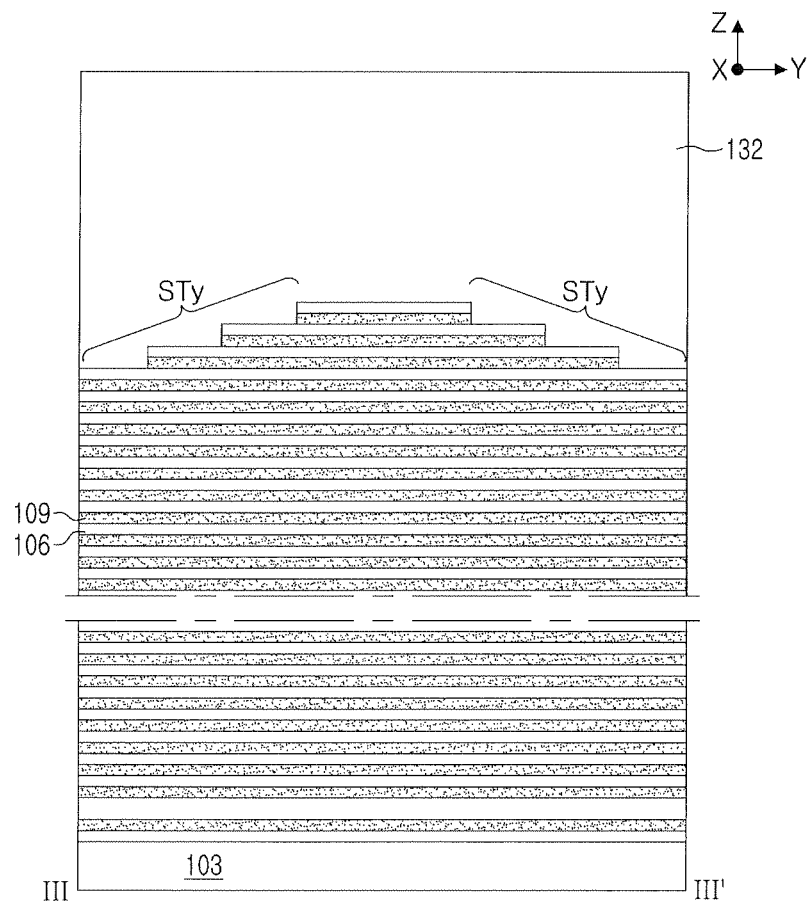
Figure 23:
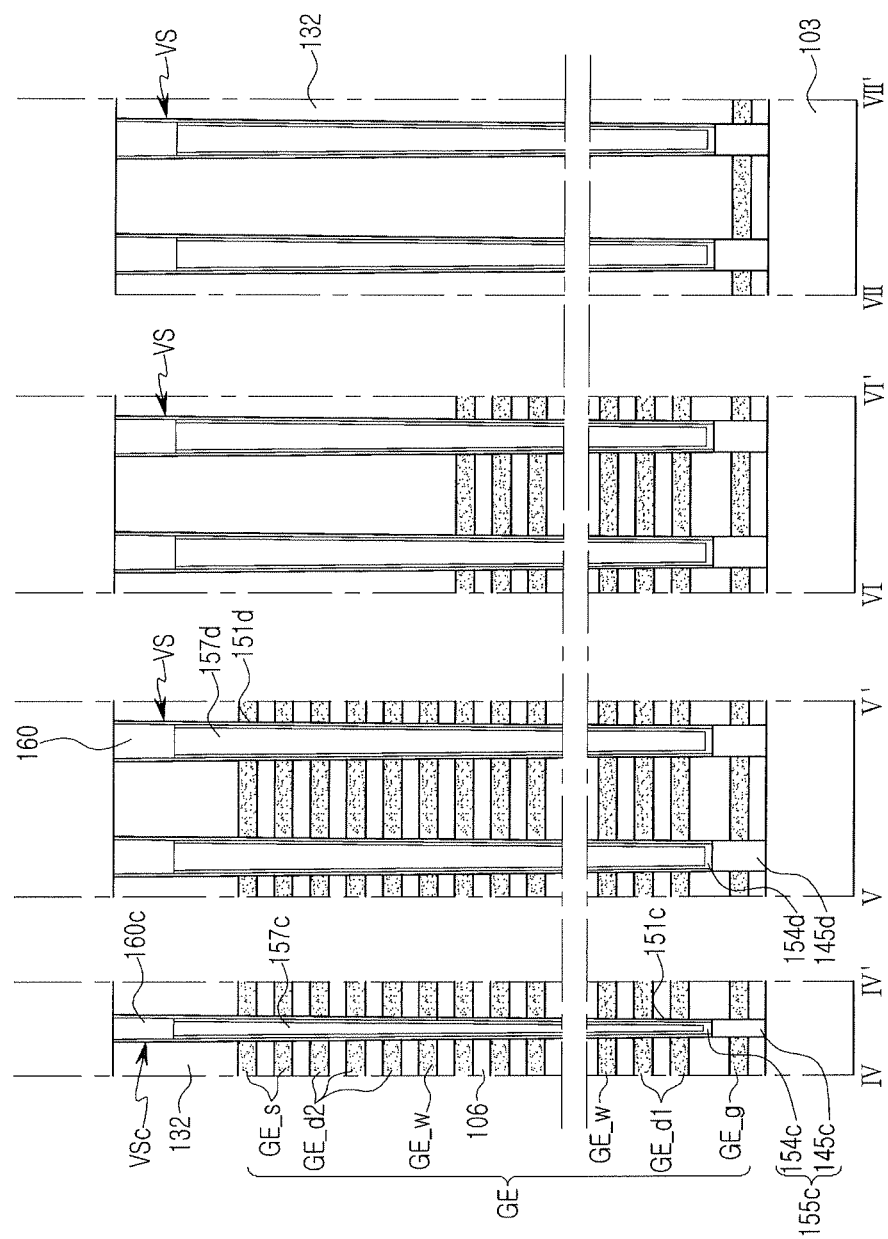

Referring to FIGS. 13 and 23, together with FIGS. 11, 22A, and 22B, a first insulating layer 132 may be formed on the molding structure 112. Insulating line patterns (ISP of FIG. 11B) passing through an uppermost sacrificial layer and a next uppermost sacrificial layer, among the sacrificial layers 109 of the molding structure 112, while passing through the first insulating layer 132 may be formed.

In some embodiments, before the first insulating layer 132 is formed, an interlayer insulating layer, among the interlayer insulating layers 106, located at an uppermost position, is removed, so the sacrificial layers 109 may be exposed. Subsequently, on sacrificial layers, among the sacrificial layers 109, corresponding to pad regions described previously, the same material as the sacrificial layers is formed, so thicknesses of the sacrificial layers may be increased. Portions of sacrificial layers, of which thicknesses are increased, may be portions for formation of pad regions, of which thicknesses are increased and which are described with reference to FIG. 5.

Cell vertical structures VSc and preliminary dummy vertical structures VS, passing through the first insulating layer 132 and the molding structure 112, may be formed.

Forming the cell vertical structures VSc and the preliminary dummy vertical structures VS may include forming holes allowing the substrate 103 to be exposed while passing through the first insulating layer 132 and the molding structure 112, allowing lower channel layers to grow from the substrate 103, exposed by the holes by conducting an epitaxial process, forming first gate dielectrics on side walls of the holes, forming upper channel layers on a side wall of the holes, forming core patterns partially filling a remaining portion of the holes, and forming pad layers on the core patterns. Thus, the cell vertical structures VSc and the preliminary dummy vertical structures VS may be formed of the same material.

In some embodiments, holes for formation the preliminary dummy vertical structures VS may be greater than holes for formation of the cell vertical structures VSc.

Thus, the cell vertical structures VSc may include the lower cell channel layer 145c, the first gate dielectric 151c, the upper cell channel layer 154c, the cell core pattern 157c, and the cell pad layer 160c, the same as those described with reference to FIGS. 12A, 12B, 13, and 14.

The preliminary dummy vertical structures VS may include a lower dummy channel layer 145d, a dummy gate dielectric 151d, an upper channel layer 154, a dummy core pattern 157d, and a pad layer 160, corresponding to the lower cell channel layer 145c, the first gate dielectric 151c, the upper cell channel layer 154c, each of the cell core pattern 157c and the cell pad layer 160c, respectively.

Figure 24:
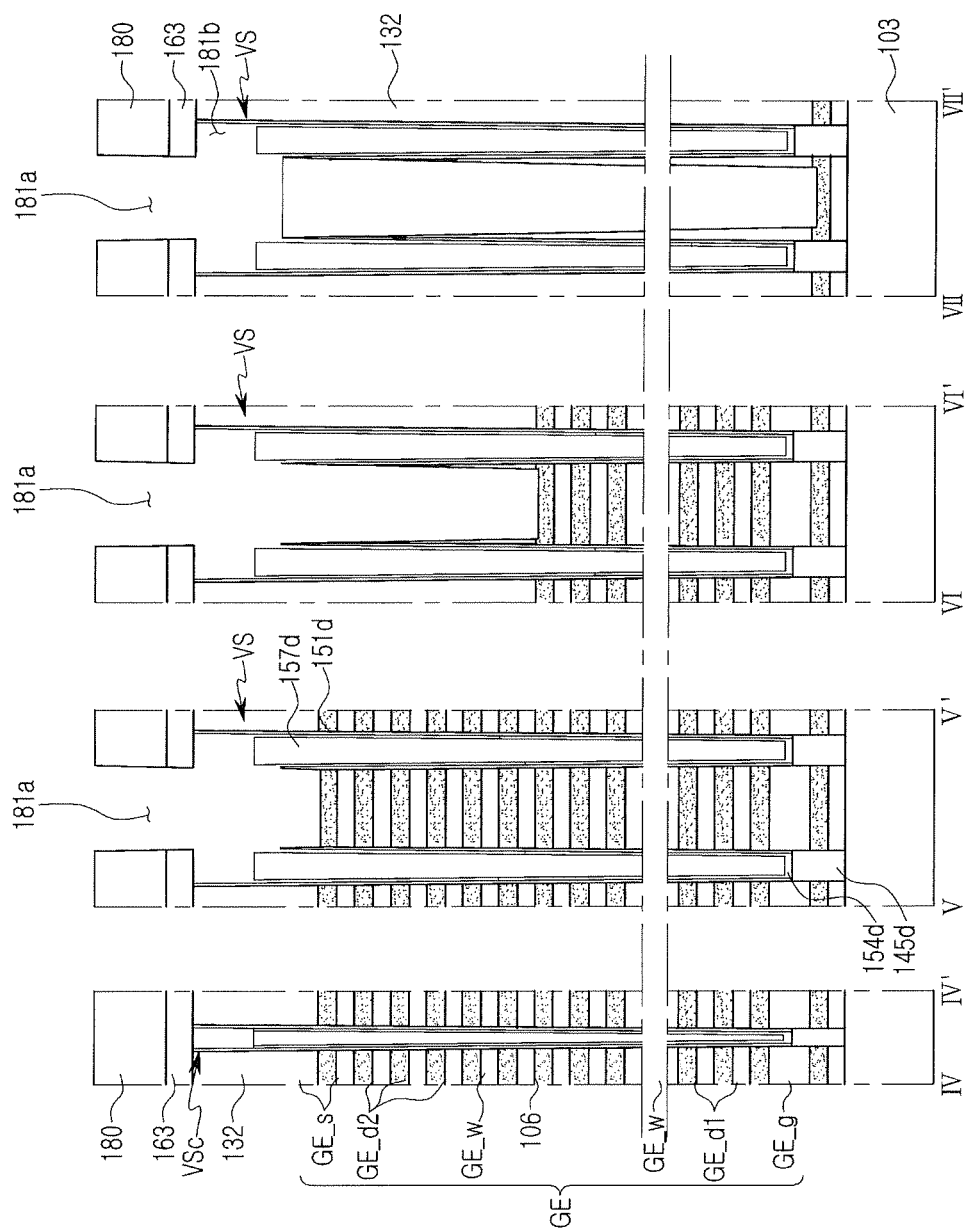

Referring to FIGS. 11, 13, and 24, the first insulating layer 132, and a second insulating layer 163, covering the cell vertical structures VSc and the preliminary dummy vertical structure VS, may be formed.

Subsequently, a gate replacement process for replacing the sacrificial layers 109 with gates and a process of forming the separation structures MS, SS1, and SS2 may be conducted. The gate replacement process and the process of forming the separation structures MS, SS1, and SS2 will be described with reference to FIGS. 12B and 12C.

Referring to FIGS. 12B and 12C, trenches exposing the substrate 103 while passing through the first insulating layer 132 and the second insulating layer 162 and passing through the mold structure (112 of FIGS. 22A and 22B) are formed, empty spaces are formed by removing the sacrificial layers (109 of FIGS. 22A and 22B) exposed by the trenches, gates are formed in the empty spaces, impurity regions 178 are formed in the substrate 103 below the trenches by conducting an ion implantation process, and the separation structures MS, SS1, and SS2, filling the trenches, may be formed. The gates may include the second gate dielectric (169 of FIG. 2) and the gate electrodes GE, described with reference to FIG. 2. The separation structures MS, SS1, and SS2 may include spacers 176 on a side wall of the trenches, and conductive patterns 179 surrounding a side wall by the spacers 176.

Again, referring to FIGS. 11, 13, and 24, a third insulating layer 180 may be formed on the second insulating layer 163. Contact holes 181a exposing pad regions of the gate electrodes GE while passing through the first insulating layer 132, the second insulating layer 163, and the third insulating layer 180, may be formed. The contact holes 181a may expose portions of the pad layer (160 of FIG. 23) and the upper channel layer (154 of FIG. 23) of the preliminary dummy vertical structures VS. Subsequently, empty spaces 181b may be formed by etching the pad layer (160 of FIG. 23) and the upper channel layer (154 of FIG. 23), which may be exposed by the contact holes 181a. The upper channel layer (154 of FIG. 23) remains, and thus may be formed as an upper dummy channel layer 154d.

Figure 25:
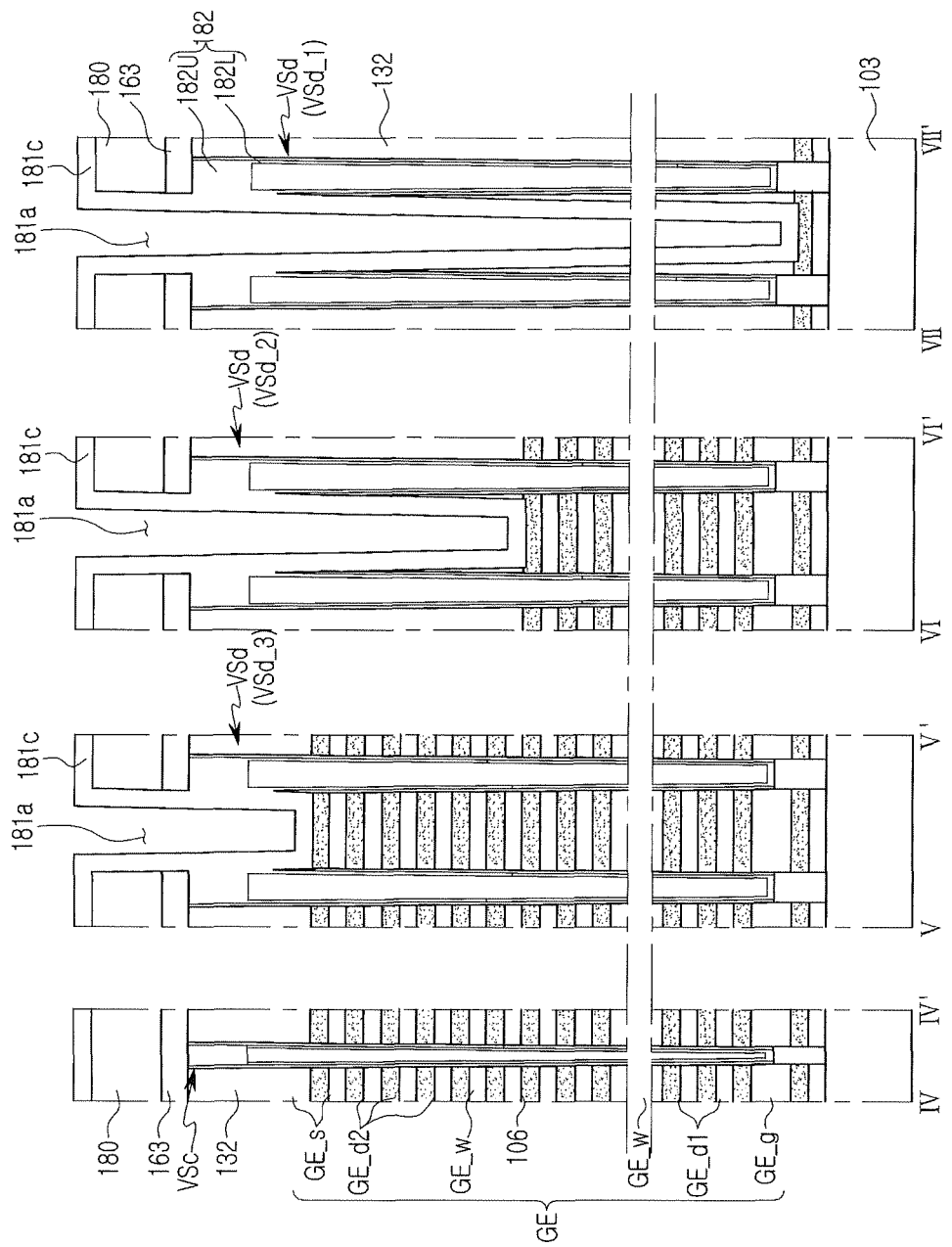

Referring to FIGS. 25, together with FIGS. 11 and 13, while the empty spaces (181b of FIG. 24), formed by etching the pad layer (160 of FIG. 23) and the upper channel layer (154 of FIG. 23), are filled, a buffer layer 181c covering side walls of the contact holes 181a may be formed. A buffer layer formed in the empty spaces (181b of FIG. 24) may be defined as the buffer region 182.

Again, referring to FIGS. 11, 12A, 12B, 12C, 13, and 14, the buffer layer (181c of FIG. 25) is etched, so pad regions of the gate electrodes GE may be exposed. Subsequently, the gate contact plugs 186 may be formed in the contact holes (181a of FIG. 25).

In some embodiments described above, the dummy vertical structures VSd may prevent a defect in which the gate electrodes GE are collapsed during a process of forming the gate electrodes GE by supporting pad regions of the gate electrodes GE while passing through pad regions of the gate electrodes GE.

In some embodiments described above, the buffer regions 182 in the dummy vertical structures VSd may prevent an electrical bridge or an electrical short between the gate contact plugs 186 formed on pad regions of the gate electrodes GE and dummy channel layers 155*d* in the dummy vertical structures VSd may be prevented.

As set forth above, according to example embodiments of the present inventive concept, a three-dimensional semiconductor device including dummy vertical structures preventing a defect in which gate electrodes are collapsed by supporting pad regions of gate electrodes while passing through pad regions of gate electrodes may be provided. Moreover, a three-dimensional semiconductor device including dummy vertical structures preventing an electrical bridge with gate contact plugs formed on pad regions of gate electrodes may be provided.

While example embodiments have been shown and described above, it will be apparent to those skilled in the art that modifications and variations could be made without departing from the scope of the present disclosure, as defined by the appended claims.

What is claimed is:

1. A three-dimensional semiconductor device, comprising:
    a gate electrode on a substrate and having a pad region;
    a cell vertical structure passing through the gate electrode;
    a dummy vertical structure passing through the pad region; and
    a gate contact plug on the pad region,
    wherein the cell vertical structure includes a cell pad layer on a level higher than that of the gate electrode and a cell channel layer opposing the gate electrode;
    wherein the dummy vertical structure includes a buffer region including a material different from a material of the cell pad layer and a dummy channel layer including a same material as a material of the cell channel layer; and
    wherein at least a portion of the buffer region is on a same plane as at least a portion of the cell pad layer.

2. The three-dimensional semiconductor device of claim 1, wherein the buffer region includes a lower portion and an upper portion on the lower portion.

3. The three-dimensional semiconductor device of claim 2, wherein the upper portion of the buffer region is located on a same plane as the cell pad layer.

4. The three-dimensional semiconductor device of Claim wherein the cell vertical structure further includes a cell core pattern;
    wherein the dummy vertical structure further includes a dummy core pattern including a same material as a material of the cell core pattern and having a greater width than that of the cell core pattern;
    wherein the cell pad layer is on the cell core pattern;
    wherein the cell channel layer is on a side surface of the cell core pattern;
    wherein the upper portion of the buffer region is on the dummy core pattern; and
    wherein the lower portion of the buffer region and the dummy channel layer are on a side surface of the dummy core pattern.

5. The three-dimensional semiconductor device of claim 1, wherein a boundary between the buffer region and the dummy channel layer includes a first boundary portion and a second boundary portion, located on different levels.

6. The three-dimensional semiconductor device of claim 1, wherein the gate contact plug is in contact with the buffer region of the dummy vertical structure.

7. The three-dimensional semiconductor device of claim 1, further comprising:
    a bit line contact plug on the cell pad layer and electrically connected to the cell pad layer;
    a bit line electrically connected to the bit line contact plug; and
    gate dielectric layers between the cell vertical structure and the gate electrode,
    wherein one among the gate dielectric layers is a data storage layer storing data.

* * * * *